US 8,194,186 B2

(12) United States Patent
Kouyama

(10) Patent No.: US 8,194,186 B2
(45) Date of Patent: Jun. 5, 2012

(54) RECEIVER CAPABLE OF GENERATING AUDIO REFERENCE CLOCK

(75) Inventor: Kunihiko Kouyama, Yokohama (JP)

(73) Assignee: Silicon Library, Inc., Kawasaki-Shi, Kanagawa (JP)

( * ) Notice: Subject to any disclaimer, the term of this patent is extended or adjusted under 35 U.S.C. 154(b) by 549 days.

(21) Appl. No.: 12/427,995

(22) Filed: Apr. 22, 2009

(65) Prior Publication Data

US 2009/0268091 A1    Oct. 29, 2009

(30) Foreign Application Priority Data

Apr. 23, 2008  (JP) ................. 2008-113188

(51) Int. Cl.
*H04N 7/00* (2006.01)
*H04N 11/00* (2006.01)
*H03L 7/00* (2006.01)

(52) U.S. Cl. ........ 348/515; 348/537; 348/552; 348/723; 348/473; 348/484

(58) Field of Classification Search ............... 348/515, 348/537, 552, 723, 473, 484
See application file for complete search history.

(56) References Cited

U.S. PATENT DOCUMENTS

| | | | |
|---|---|---|---|
| 5,714,896 A | 2/1998 | Nakagawa et al. | |
| 6,044,124 A | 3/2000 | Monahan et al. | |
| 6,075,834 A | 6/2000 | Kojima et al. | |
| 6,891,910 B2 | 5/2005 | Hwang et al. | |
| 6,914,637 B1 * | 7/2005 | Wolf et al. | 348/473 |
| 7,049,852 B2 | 5/2006 | Melanson | |
| 7,088,398 B1 | 8/2006 | Wolf et al. | |
| 7,257,163 B2 | 8/2007 | Hwang et al. | |
| 7,283,566 B2 | 10/2007 | Siemens et al. | |
| 7,315,598 B2 | 1/2008 | Lee et al. | |
| 7,359,437 B2 | 4/2008 | Hwang et al. | |
| 7,394,499 B2 | 7/2008 | Okamoto et al. | |
| 7,474,358 B2 | 1/2009 | Miyamoto | |
| 2002/0085656 A1 | 7/2002 | Lee et al. | |
| 2004/0252235 A1 | 12/2004 | Ejima | |
| 2006/0133555 A1 | 6/2006 | Tsukamoto et al. | |
| 2006/0209969 A1 | 9/2006 | Miyamoto | |
| 2007/0005163 A1 | 1/2007 | Takahashi et al. | |

(Continued)

FOREIGN PATENT DOCUMENTS

JP    54-025658 A    2/1979

(Continued)

OTHER PUBLICATIONS

U.S. Appl. No. 09/954,663, filed Sep. 12, 2001, Vlahos.

(Continued)

*Primary Examiner* — Brian Yenke
(74) *Attorney, Agent, or Firm* — Buchanan Ingersoll & Rooney PC

(57) ABSTRACT

A receiver for use in a system for transmission from a transmitter to a receiver, the receiver includes a first frequency divider for outputting a first signal by dividing a signal with a frequency corresponding to a pixel clock or an integral multiple thereof by a reciprocal of an integral multiple of a first natural number, the integral multiple of the first natural number being greater than or equal to 1; and a cycle control portion for outputting a second signal having first and second cycles included within a cycle of the first signal by controlling a cycle of the pixel clock.

26 Claims, 19 Drawing Sheets

U.S. PATENT DOCUMENTS

| | | | |
|---|---|---|---|
| 2007/0121008 A1 | 5/2007 | Kanoh | |
| 2007/0291856 A1* | 12/2007 | Fastert et al. | 375/240.28 |
| 2008/0024661 A1* | 1/2008 | Tung | 348/537 |
| 2008/0061854 A1* | 3/2008 | Tung et al. | 327/291 |
| 2008/0122977 A1 | 5/2008 | Miyamoto | |
| 2008/0133249 A1* | 6/2008 | Hashiguchi et al. | 704/500 |
| 2008/0151116 A1* | 6/2008 | Wang et al. | 348/515 |
| 2008/0152057 A1 | 6/2008 | Lee et al. | |
| 2009/0115897 A1* | 5/2009 | Yamasaki et al. | 348/484 |
| 2009/0167366 A1* | 7/2009 | Wang | 327/105 |
| 2010/0189104 A1* | 7/2010 | Ichimura | 370/389 |

FOREIGN PATENT DOCUMENTS

| | | |
|---|---|---|
| JP | 59-151535 A | 8/1984 |
| JP | 02-096429 A | 4/1990 |
| JP | 02-271717 A | 11/1990 |
| JP | 03-128529 A | 5/1991 |
| JP | 03-155219 A | 7/1991 |
| JP | 04-083425 A | 3/1992 |
| JP | 08-242165 A | 9/1996 |
| JP | 10-233680 A | 9/1998 |
| JP | 11-098007 A | 4/1999 |
| JP | 2003-520495 A | 7/2003 |
| JP | 2004-023187 A | 1/2004 |
| JP | 2004-080557 A | 3/2004 |
| JP | 2004-507963 A | 3/2004 |
| JP | 2004-514325 A | 5/2004 |
| JP | 2004-208337 A | 7/2004 |
| JP | 2004-523187 A | 7/2004 |
| JP | 2004-523188 A | 7/2004 |
| JP | 2005-033581 A | 2/2005 |
| JP | 2005-065093 A | 3/2005 |
| JP | 2005-514836 A | 5/2005 |
| JP | 2005-514849 A | 5/2005 |
| JP | 2005-514873 A | 5/2005 |
| JP | 2006-174197 A | 6/2006 |
| JP | 2006-325234 A | 11/2006 |
| JP | 2007-013853 A | 1/2007 |
| JP | 2007-082001 A | 3/2007 |
| JP | 2007-150855 A | 6/2007 |
| WO | WO 01/052469 A1 | 7/2001 |
| WO | WO 02/019528 A3 | 3/2002 |
| WO | WO 02/039683 A3 | 5/2002 |
| WO | WO 02/078336 A1 | 10/2002 |
| WO | WO 03/024067 A1 | 3/2003 |
| WO | WO 03/024068 A1 | 3/2003 |
| WO | WO 03/058376 A3 | 7/2003 |
| WO | WO 03/058826 A3 | 7/2003 |
| WO | WO 03/058946 A3 | 7/2003 |
| WO | WO 03/107667 A1 | 12/2003 |
| WO | WO 03/107686 A1 | 12/2003 |
| WO | WO 2004/019546 A1 | 3/2004 |

OTHER PUBLICATIONS

"High-Definition Multimedia Interface Specification Version 1.3a", P98-P111, Nov. 10, 2006, Hitachi, Ltd., Matsushita Electric Industrial Co., Ltd., Philips Consumer Electronics, International B.V., Silicon Image, Inc., Sony Corporation, Thomson Inc., Toshiba Corporation.

Japanese Office Action dated Feb. 25, 2009.

* cited by examiner

F I G. 5

| CTSquo | CTSquo | CTSquo | ... | CTSquo | CTSrem |
|--------|--------|--------|-----|--------|--------|
| 1      | 2      | 3      |     | N      | N+1    |

F I G. 6

| CTSquo | CTSquo | CTSquo | ... | CTSquo | CTSquo+1 | CTSquo+1 | CTSquo+1 | CTSrem |
|--------|--------|--------|-----|--------|----------|----------|----------|--------|
| 1      | 2      | 3      |     |        | 1        | 2        | ...      |        |

N−CTSrem (FIRST VALUE)

SECOND VALUE

FIG. 7

| REMAINDER \ COUNT CODE | 0 | 1 | 2 | 3 | 4 | 5 | 6 | 7 | 8 | 9 | 10 | 11 | 12 |
|---|---|---|---|---|---|---|---|---|---|---|---|---|---|
| 12 | 6 | 6 | 6 | 6 | 6 | 6 | 6 | 6 | 6 | 6 | 6 | 6 | 6 |
| 11 | 6 | 5 | 4 | 3 | 2 | 1 | 0 | 11 | 10 | 9 | 8 | 7 | 6 |
| 10 | 6 | 4 | 2 | 0 | 10 | 8 | 6 | 4 | 2 | 0 | 10 | 8 | 6 |
| 9 | 6 | 3 | 0 | 9 | 6 | 3 | 0 | 9 | 6 | 3 | 0 | 9 | 6 |
| 8 | 6 | 2 | 10 | 6 | 2 | 10 | 6 | 2 | 10 | 6 | 2 | 10 | 6 |
| 7 | 6 | 1 | 8 | 3 | 10 | 5 | 0 | 7 | 2 | 9 | 4 | 11 | 6 |
| 6 | 6 | 0 | 6 | 0 | 6 | 0 | 6 | 0 | 6 | 0 | 6 | 0 | 6 |
| 5 | 6 | 11 | 4 | 9 | 2 | 7 | 0 | 5 | 10 | 3 | 8 | 1 | 6 |
| 4 | 6 | 10 | 2 | 6 | 10 | 2 | 6 | 10 | 2 | 6 | 10 | 2 | 6 |
| 3 | 6 | 9 | 0 | 3 | 6 | 9 | 0 | 3 | 6 | 9 | 0 | 3 | 6 |
| 2 | 6 | 8 | 10 | 0 | 2 | 4 | 6 | 8 | 10 | 0 | 2 | 4 | 6 |
| 1 | 6 | 7 | 8 | 9 | 10 | 11 | 0 | 1 | 2 | 3 | 4 | 5 | 6 |
| 0 | 6 | 6 | 6 | 6 | 6 | 6 | 6 | 6 | 6 | 6 | 6 | 6 | 6 |

VALUE IN REMAINDER LATCH 65 WHERE N = 13

FIG. 8

| REMAINDER \ COUNT CODE | 0 | 1 | 2 | 3 | 4 | 5 | 6 | 7 | 8 | 9 | 10 | 11 | 12 |
|---|---|---|---|---|---|---|---|---|---|---|---|---|---|
| 12 | 0 | 1 | 1 | 1 | 1 | 1 | 1 | 1 | 1 | 1 | 1 | 1 | 1 |
| 11 | 0 | 1 | 1 | 1 | 1 | 1 | 1 | 0 | 1 | 1 | 0 | 1 | 1 |
| 10 | 0 | 1 | 1 | 0 | 0 | 1 | 1 | 1 | 1 | 1 | 1 | 1 | 1 |
| 9 | 0 | 1 | 0 | 1 | 1 | 0 | 1 | 0 | 0 | 0 | 1 | 0 | 1 |
| 8 | 0 | 1 | 0 | 1 | 0 | 1 | 0 | 1 | 0 | 1 | 1 | 0 | 1 |
| 7 | 0 | 1 | 0 | 1 | 0 | 1 | 0 | 0 | 1 | 1 | 0 | 1 | 1 |
| 6 | 0 | 0 | 1 | 0 | 1 | 1 | 1 | 0 | 0 | 0 | 0 | 1 | 0 |
| 5 | 0 | 0 | 1 | 0 | 0 | 0 | 0 | 0 | 0 | 1 | 1 | 1 | 0 |
| 4 | 0 | 0 | 0 | 1 | 0 | 0 | 1 | 0 | 0 | 0 | 0 | 0 | 0 |
| 3 | 0 | 0 | 0 | 0 | 0 | 0 | 0 | 0 | 0 | 0 | 0 | 0 | 0 |
| 2 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 |

VALUE IN QUOTIENT LATCH 66 WHERE N = 13

FIG. 16

| | Fs | MCLK | fTMDS_clock | N | CTS | MCLK0 | VCOCLK | Ndiv | Npre | Npostdiv | a | b | c | d | Y |
|---|---|---|---|---|---|---|---|---|---|---|---|---|---|---|---|
| FIRST EMBODIMENT | 48.0E+3 | 256Fs | 74.25E+6 | 6144 | 74250 | 6.144E+6 | 589.824E+6 | — | 96 | 48 | — | — | 16 | — | 1 |
| | 44.1E+3 | 256Fs | 74.25E+6 | 6272 | 82500 | 5.6448E+6 | 541.9008E+6 | — | 96 | 48 | — | — | 16 | — | 1 |
| | 192.0E+3 | 256Fs | 27.00E+6 | 24576 | 27000 | 24.576E+6 | 541.9008E+6 | — | 24 | 12 | — | — | 64 | — | 2 |
| | 176.4E+3 | 256Fs | 27.00E+6 | 25088 | 30000 | 22.5792E+6 | 541.9008E+6 | — | 24 | 12 | — | — | 64 | — | 2 |
| SECOND EMBODIMENT | 48.0E+3 | 256Fs | 74.25E+6 | 6144 | 74250 | 6.144E+6 | 589.824E+6 | 16 | 96 | 48 | — | — | — | — | 1 |
| | 44.1E+3 | 256Fs | 74.25E+6 | 6272 | 82500 | 5.6448E+6 | 541.9008E+6 | 16 | 96 | 48 | — | — | — | — | 1 |
| | 192.0E+3 | 256Fs | 27.00E+6 | 24576 | 27000 | 24.576E+6 | 589.824E+6 | 64 | 24 | 12 | — | — | — | — | 2 |
| | 176.4E+3 | 256Fs | 27.00E+6 | 25088 | 30000 | 22.5792E+6 | 541.9008E+6 | 64 | 24 | 12 | — | — | — | — | 2 |
| THIRD EMBODIMENT | 48.0E+3 | 256Fs | 74.25E+6 | 6144 | 74250 | 6.144E+6 | 589.824E+6 | — | 96 | 48 | — | — | — | — | 1 |
| | 44.1E+3 | 256Fs | 74.25E+6 | 6272 | 82500 | 5.6448E+6 | 541.9008E+6 | — | 96 | 48 | — | — | — | — | 1 |
| | 192.0E+3 | 256Fs | 27.00E+6 | 24576 | 27000 | 24.576E+6 | 589.824E+6 | — | 24 | 12 | — | — | — | — | 2 |
| | 176.4E+3 | 256Fs | 27.00E+6 | 25088 | 30000 | 22.5792E+6 | 541.9008E+6 | — | 24 | 12 | — | — | — | — | 2 |
| FOURTH EMBODIMENT | 48.0E+3 | 256Fs | 74.25E+6 | 6144 | 74250 | 6.144E+6 | 589.824E+6 | — | 96 | 48 | 16 | — | — | — | 1 |
| | 44.1E+3 | 256Fs | 74.25E+6 | 6272 | 82500 | 5.6448E+6 | 541.9008E+6 | — | 96 | 48 | 16 | — | — | — | 1 |
| | 192.0E+3 | 256Fs | 27.00E+6 | 24576 | 27000 | 24.576E+6 | 589.824E+6 | — | 24 | 12 | 64 | — | — | — | 2 |
| | 176.4E+3 | 256Fs | 27.00E+6 | 25088 | 30000 | 22.5792E+6 | 541.9008E+6 | — | 24 | 12 | 64 | — | — | — | 2 |
| FIFTH EMBODIMENT | 48.0E+3 | 256Fs | 74.25E+6 | 6144 | 74250 | 6.144E+6 | 589.824E+6 | — | 96 | 48 | 16 | — | — | — | 1 |
| | 44.1E+3 | 256Fs | 74.25E+6 | 6272 | 82500 | 5.6448E+6 | 541.9008E+6 | — | 96 | 48 | 16 | — | — | — | 1 |
| | 192.0E+3 | 256Fs | 27.00E+6 | 24576 | 27000 | 24.576E+6 | 589.824E+6 | — | 24 | 12 | 64 | — | — | — | 2 |
| | 176.4E+3 | 256Fs | 27.00E+6 | 25088 | 30000 | 22.5792E+6 | 541.9008E+6 | — | 24 | 12 | 64 | — | — | — | 2 |
| SIXTH EMBODIMENT | 48.0E+3 | 256Fs | 74.25E+6 | 6144 | 74250 | 6.144E+6 | 589.824E+6 | — | — | 48 | 16 | 768 | — | — | 1 |
| | 44.1E+3 | 256Fs | 74.25E+6 | 6272 | 82500 | 5.6448E+6 | 541.9008E+6 | — | — | 48 | 16 | 768 | — | — | 1 |
| | 192.0E+3 | 256Fs | 27.00E+6 | 24576 | 27000 | 24.576E+6 | 589.824E+6 | — | — | 12 | 64 | 768 | — | — | 2 |
| | 176.4E+3 | 256Fs | 27.00E+6 | 25088 | 30000 | 22.5792E+6 | 541.9008E+6 | — | — | 12 | 64 | 768 | — | — | 2 |
| SEVENTH EMBODIMENT | 48.0E+3 | 256Fs | 74.25E+6 | 6144 | 74250 | 6.144E+6 | 589.824E+6 | — | 96 | 48 | — | — | 16 | — | 1 |
| | 44.1E+3 | 256Fs | 74.25E+6 | 6272 | 82500 | 5.6448E+6 | 541.9008E+6 | — | 96 | 48 | — | — | 16 | — | 1 |
| | 192.0E+3 | 256Fs | 27.00E+6 | 24576 | 27000 | 24.576E+6 | 589.824E+6 | — | 24 | 12 | — | — | 64 | — | 2 |
| | 176.4E+3 | 256Fs | 27.00E+6 | 25088 | 30000 | 22.5792E+6 | 541.9008E+6 | — | 24 | 12 | — | — | 64 | — | 2 |
| EIGHTH EMBODIMENT | 48.0E+3 | 256Fs | 74.25E+6 | 6144 | 74250 | 6.144E+6 | 589.824E+6 | — | — | 48 | — | — | 16 | 768 | 1 |
| | 44.1E+3 | 256Fs | 74.25E+6 | 6272 | 82500 | 5.6448E+6 | 541.9008E+6 | — | — | 48 | — | — | 16 | 768 | 1 |
| | 192.0E+3 | 256Fs | 27.00E+6 | 24576 | 27000 | 24.576E+6 | 589.824E+6 | — | — | 12 | — | — | 64 | 768 | 2 |
| | 176.4E+3 | 256Fs | 27.00E+6 | 25088 | 30000 | 22.5792E+6 | 541.9008E+6 | — | — | 12 | — | — | 64 | 768 | 2 |

FIG. 17

| N \ Fs | 32.0K | 44.1K | 48.0K | 88.2K | 96.0K | 176.4K | 192.0K | 768.0K |
|---|---|---|---|---|---|---|---|---|
| 4 | – | – | – | – | – | – | – | – |
| 128 | 144 | – | 96 | – | 48 | – | 24 | 192 |
| 256 | 72 | – | 48 | – | 24 | – | 12 | 6 |
| 384 | 48 | – | 32 | – | 16 | – | 8 | – |
| 512 | 36 | – | 24 | – | 12 | – | 6 | – |

$\underbrace{\qquad\qquad\qquad\qquad\qquad}_{\text{Npostdiv}}$

FIG. 18

| N \ Fs | 32.0K | 44.1K | 48.0K | 88.2K | 96.0K | 176.4K | 192.0K | 768.0K |
|---|---|---|---|---|---|---|---|---|
| 4 | – | – | – | – | – | – | – | – |
| 128 | – | 96 | – | 48 | – | 24 | – | 192 |
| 256 | – | 48 | – | 24 | – | 12 | – | – |
| 384 | – | 32 | – | 16 | – | 8 | – | – |
| 512 | – | 24 | – | 12 | – | 6 | – | – |

$\underbrace{\qquad\qquad\qquad\qquad\qquad}_{\text{Npostdiv}}$

US 8,194,186 B2

RECEIVER CAPABLE OF GENERATING AUDIO REFERENCE CLOCK

BACKGROUND OF THE INVENTION

1. Field of the Invention

The present invention relates to receivers for use in a system in which a pixel clock required for video data reproduction is transmitted from a transmitter to a receiver, and more particularly, the invention relates to a receiver capable of generating an audio reference clock required for audio data reproduction.

2. Description of the Background Art

In recent years, standards called DVI (Digital Visual Interface), HDMI (High Definition Multimedia Interface), and LVDS (Low Voltage Differential Signaling) have been used as universal display interface standards. In these standards, the transmitter transmits video data and a pixel clock to the receiver in the form of a digital signal without modification. The receiver reproduces the video data based on the transmitted pixel clock.

FIG. 19 is a block diagram illustrating a general system concept where data is transmitted from a transmission-side electronic device 900 to a reception-side electronic device 903 in accordance with a standard as described above. In FIG. 19, the transmission-side electronic device 900 includes a data source 901 and a transmitter 902. Video and audio data outputted by the data source 901 is inputted to the transmitter 902, and converted into serial digital signals Tx0, Tx1, and Tx2. The transmitter 902 transmits the serial digital signals Tx0, Tx1, and Tx2 to a receiver 904, along with a pixel clock Txc outputted by the data source 901. The digital signals Tx0, Tx1, and Tx2 and the pixel clock Txc are transferred to the receiver 904 via a dedicated cable 906. The receiver 904 reproduces the video and audio data outputted by the data source 901 based on the digital signals Tx0, Tx1, and Tx2 and the pixel clock Txc, and sends the reproduced data to an output portion 905. The output portion 905 outputs image and audio based on the digital data from the receiver 904.

FIG. 20 is a block diagram illustrating features of a system according to the HDMI standard that are used for generating an audio reference clock required for audio data reproduction (see FIG. 15 and paragraphs [0268] to [0272] of Japanese National Phase PCT Laid-Open Publication No. 2005-514836). In FIG. 20, the transmitter 902 includes a register 907, a frequency divider 908, a cycle time counter 909, and a transmission portion 910. The transmitter 902 receives a pixel clock, an audio reference clock with a frequency of 128×Fs, and a natural number N. Here, Fs is a sampling frequency of, for example, 44.1 kHz or 48.0 kHz. The register 907 temporarily stores the natural number N. The frequency divider 908 divides the audio reference clock at a dividing ratio of 1/N based on the natural number N being temporarily stored in the register 907, thereby generating an intermediate clock, which is inputted to the cycle time counter 909. The cycle time counter 909 counts the number of pixel clocks during each cycle period of the intermediate clock, and outputs the count result as a CTS (Cycle Time Stamp). The transmission portion 910 transmits the pixel clock to the receiver 904 via a physical layer, and if necessary, properly transmits CTS and N in packets to the receiver 904.

By using such an architecture in the transmitter 902, a rational relationship is established between the pixel clock and the audio reference clock. When dividing the pixel clock frequency (fTMDS_clock) by the audio reference clock frequency (128×Fs), the denominator is N, and the numerator is CTS.

That is, the following relationship is established:

$$128 \times Fs = (fTMDS\_clock \times N)/CTS.$$

Also, the cycle time counter 909 uses CTS as a value for the number of pixel clocks counted during each cycle period of the intermediate clock, and therefore fTMDS_clock is divisible by CTS.

The receiver 904 includes a reception portion 911, a frequency divider 912, and a multiplier 913. The receiver 911 reproduces the pixel clock, CTS, and N. The frequency divider 912 divides the pixel clock at a dividing ratio of 1/CTS to reproduce and input the intermediate clock to the multiplier 913. FIG. 21 is a block diagram illustrating a detailed functional configuration of the multiplier 913 in the receiver 904. The multiplier 913 includes a phase detector 914, a low-pass filter 915, a voltage-controlled oscillator 916, and a frequency divider 917. The voltage-controlled oscillator 916 has an oscillating frequency set to be N times the frequency of the intermediate clock outputted by the frequency divider 912. The frequency divider 917 with a dividing ratio of 1/N divides and feeds back the output of the voltage-controlled oscillator 916. The PLL (phase-locked loop) circuit thus formed multiplies the frequency of the intermediate clock by N. Thus, the multiplier 913 can output an audio reference clock with a frequency of 128×Fs. In this manner, the HDMI standard employs the architecture capable of generating the audio reference clock based on the pixel clock.

Note that Japanese Laid-Open Patent Publication No. 10-233680 describes a diffusion-type fractional frequency divider in which a dividing number defined by the ratio of an input frequency to an output frequency is changed between two states of M and M+1, and a time point when the dividing number becomes M+1 is controlled based on random numbers or sequential numbers similar to the random numbers. Thus, the diffusion-type fractional frequency divider can provide an output signal with reduced spurious components.

Also, Japanese Laid-Open Patent Publication No. 2005-33581 describes a fractional-N frequency synthesizer including a feedback circuit taking advantage of the absence of periodicity in an output signal of a $\Delta\Sigma$ modulation circuit. Other examples of the related art for adjusting the dividing ratio using a $\Delta\Sigma$ modulation circuit include technologies as described in the specifications of U.S. Pat. Nos. 6,044,124 and 7,049,852.

Also, general information about audio reference clock reproduction according to the HDMI standard is described in Japanese Laid-Open Patent Publication Nos. 2007-13853 and 2007-150855, as well as in "High-Definition Multimedia Interface Specification Version 1.3a", pp. 98 to 111, Nov. 10, 2006, Hitachi, Ltd., Matsushita Electric Industrial Co., Ltd., Philips Consumer Electronics, International B.V., Silicon Image, Inc., Sony Corporation, Thomson Inc., Toshiba Corporation.

For example, a case is considered where the pixel clock frequency is 74.25 MHz, the sampling frequency is 48.0 kHz, the audio reference clock frequency is 128×48.0 kHz, N is 6144, and CTS is 74250. In this case, the intermediate clock outputted by the frequency divider 912 is at a frequency of 1 kHz. In this manner, when a conventional HDMI architecture is used, the intermediate clock, i.e., the reference signal for the PLL circuit is at low frequency. Accordingly, to remove noise from the reference signal, it is necessary to lower the cut-off frequency of the low-pass filter in the PLL circuit. When the cut-off frequency of the low-pass filter is low, the filter has a large multiplier factor, making it difficult to achieve an on-chip low-pass filter.

Also, in the manufacturing stage, it is often the case that an audio test is performed at around 1 kHz. When the reference frequency is at around 1 kHz, there is a possibility where noise in the reference signal is outputted as audio during the test, thereby undesirably rendering the test inaccurate. Furthermore, it is also undesirable that the noise be present not only at around 1 kHz but also in an audio band (e.g., 20 Hz to 20 kHz). Accordingly, it is necessary to increase the reference frequency, thereby keeping noise out of the audio band, and also to use a cut-off frequency higher than the audio band, thereby cutting off noise.

Also, when the reference frequency is at around 1 kHz, and noise in the reference signal cannot be removed appropriately, jitter in the audio reference clock increases, which can lead to inaccurate audio data reproduction.

SUMMARY OF THE INVENTION

Therefore, an object of the present invention is to provide a receiver capable of increasing a reference frequency to be inputted to a PLL circuit when generating an audio reference clock required for audio data reproduction in, for example, an HDMI system in which a pixel clock required for video data reproduction is transmitted from a transmitter to a receiver.

The present invention has the following features to solve the problems mentioned above. One aspect of the present invention is directed to a receiver for use in a system with a transmitter transmitting a sampling frequency, a first natural number, and a second natural number to a receiver, along with a pixel clock required for video data reproduction, the first natural number and the second natural number being a numerator and a denominator, respectively, in a rational relationship where a frequency of the pixel clock is divided by a frequency of an audio reference clock, the receiver including a first frequency divider for outputting a first signal by dividing a signal with a frequency corresponding to the pixel clock or an integral multiple thereof by a reciprocal of an integral multiple of the first natural number, the integral multiple of the first natural number being greater than or equal to 1, and a cycle control portion for outputting a second signal having first and second cycles included within a cycle of the first signal by controlling a cycle of the pixel clock, the first cycle corresponding to a quotient which, along with a remainder, results from the integral multiple of the first natural number divided by a third natural number equal to or different from the second natural number, the number of first cycles included within the cycle of the first signal corresponding to a first value for the third natural number minus the remainder, the second cycle corresponding to a second value for the quotient plus 1, the number of second cycles included within the cycle of the first signal corresponding to the remainder, the cycle control portion calculating a sum of remainders as necessary, and controlling the cycles of the second signal when the sum exceeds a threshold.

Preferably, the cycle control portion may include a count output portion for outputting the quotient as a count a number of times corresponding to the first value, and also outputting the second value as a count a number of times corresponding to the remainder, and a programmable counter for counting the counts outputted by the count output portion, and controlling the cycle of the pixel clock.

Preferably, the count output portion may perform sequential addition of the remainder to a latch, output of the quotient as the count when the value after addition is greater than or equal to the threshold, and output of the second value as the count when the value after addition is less than the threshold.

In one embodiment, the count output portion includes a first arithmetic circuit for calculating the quotient, a second arithmetic circuit for calculating the second value, a third arithmetic circuit for calculating the remainder, a counter for repeatedly counting the third natural number between ripple carries in the first signal outputted by the first frequency divider, a remainder latch, a quotient latch, and a multiplexer for selecting as the count an output from the first or second arithmetic circuit in accordance with a value in the quotient latch. The remainder latch holds a value for the third natural number divided by 2 with any digit after the decimal point being rounded off when the third natural number is initially counted by the counter, and a remainder for a third value divided by the threshold when the third natural number is counted by the counter but not when the third natural number is initially counted, the third value resulting from a value held in the remainder latch added to the remainder calculated by the third arithmetic circuit. The quotient latch holds a quotient for the third value divided by the threshold, and the multiplexer selects an output from the second arithmetic circuit when the value held in the quotient latch is 1, and an output from the first arithmetic circuit when the value held in the quotient latch is other than 1.

Preferably, the count output portion may perform addition of the remainder to a latch, output of the second value as the count when the value after addition is greater than or equal to the threshold, and output of the quotient as the count when the value after addition is less than the threshold.

In one embodiment, the count output portion includes a first arithmetic circuit for calculating the quotient, a second arithmetic circuit for calculating the second value, a third arithmetic circuit for calculating the remainder, a counter for repeatedly counting the third natural number between ripple carries in the first signal outputted by the first frequency divider, a remainder latch, a quotient latch, and a multiplexer for selecting as the count an output from the first or second arithmetic circuit in accordance with a value in the quotient latch. The remainder latch holds a value for the third natural number divided by 2 with any digit after the decimal point being rounded off when the third natural number is initially counted by the counter, and a remainder for a third value divided by the threshold when the third natural number is counted by the counter but not when the third natural number is initially counted, the third value resulting from a value held in the remainder latch added to the remainder calculated by the third arithmetic circuit. The quotient latch holds a quotient for the third value divided by the threshold, and the multiplexer selects an output from the first arithmetic circuit when the value held in the quotient latch is 1, and an output from the second arithmetic circuit when the value held in the quotient latch is other than 1.

Preferably, the receiver may further include a PLL circuit for outputting a signal locked at a desired frequency based on a reference signal obtained from the second signal outputted by the cycle control portion, the PLL circuit including a voltage-controlled oscillator oscillating at a frequency corresponding to an integral multiple of a desired frequency obtained by integrally multiplying the sampling frequency, and a second frequency divider provided downstream of the PLL circuit for outputting a signal at the desired frequency by dividing a third signal outputted by the PLL circuit.

Preferably, the voltage-controlled oscillator may oscillate at a frequency corresponding to a common multiple of a plurality of desired frequencies, and the second frequency divider may switch between dividing ratios in accordance with the desired frequencies.

Preferably, the voltage-controlled oscillator may be capable of oscillating at a frequency corresponding to a common multiple of mutually different first and second frequencies, and the dividing ratios may be predetermined in accordance with multiples of the first and second frequencies.

Preferably, the third natural number may be equal to the second natural number, and the first frequency divider may divide the transmitted clock by a reciprocal of the first natural number.

Preferably, the receiver may further include a third frequency divider for outputting the reference signal by dividing the second signal outputted by the cycle control portion.

Preferably, the PLL circuit may include a fourth frequency divider for dividing a signal outputted by the voltage-controlled oscillator, and a fifth frequency divider for dividing and feeding back a signal outputted by the fourth frequency divider, the signal being divided at a dividing ratio equal to a dividing ratio of the third frequency divider.

Preferably, the first frequency divider may divide the pixel clock by a reciprocal of the first natural number, and the cycle control portion may divide the pixel clock by a reciprocal of the first natural number divided by a value by which the second natural number is divisible, and output the second signal in synchronization with the pixel clock being divided.

Preferably, the third natural number may be a value by which the second natural number is divisible, the first frequency divider may divide the transmitted clock by a reciprocal of the first natural number, the second signal outputted by the cycle control portion may be used as a reference signal to be inputted to the PLL circuit, and the PLL circuit may include a fourth frequency divider for dividing a signal outputted by the voltage-controlled oscillator, and a seventh frequency divider for dividing and feeding back a signal outputted by the fourth frequency divider, the signal being divided by a reciprocal of a quotient for the second natural number divided by the third natural number.

Preferably, the third natural number may be equal to the second natural number, the second signal outputted by the cycle control portion may be used as a reference signal to be inputted to the PLL circuit, and the PLL circuit may include a fourth divider circuit for dividing and feeding back a signal outputted by the voltage-controlled oscillator.

Preferably, the third natural number may be equal to the second natural number, the second signal outputted by the cycle control portion may be used as a reference signal to be inputted to the PLL circuit, the first frequency divider may divide the pixel clock by a reciprocal of the first natural number multiplied by a, where a is an integer of 2 or more, and the PLL circuit may include a fourth frequency divider for dividing a signal outputted by the voltage-controlled oscillator, and an eighth frequency divider for dividing and feeding back a signal outputted by the fourth frequency divider, the signal being divided by 1/a.

Preferably, the third natural number may be equal to the second natural number, the second signal outputted by the cycle control portion may be used as a reference signal to be inputted to the PLL circuit, the first frequency divider may divide the pixel clock by a reciprocal of the first natural number divided by a, where a is an integer of 2 or more, and the PLL circuit may include a ninth frequency divider for dividing and feeding back a signal outputted by the voltage-controlled oscillator, the signal being divided by 1/b, where b is a multiple of a.

Preferably, the third natural number may be equal to the second natural number, and the PLL circuit may feed back a signal outputted by the voltage-controlled oscillator, thereby locking an oscillating frequency.

Preferably, the third natural number may be equal to the second natural number, and the PLL circuit may include a tenth frequency divider for dividing and feeding back a signal outputted by the voltage-controlled oscillator, the signal being divided by 1/d.

Another aspect of the present invention is directed to a reception-side electronic device for use in a system with a transmission-side electronic device transmitting a sampling frequency, a first natural number, and a second natural number to a reception-side electronic device, along with a pixel clock required for video data reproduction, the first natural number and the second natural number being a numerator and a denominator, respectively, in a rational relationship where a frequency of the pixel clock is divided by a frequency of an audio reference clock, the reception-side electronic device including a first frequency divider for outputting a first signal by dividing a signal with a frequency corresponding to the pixel clock or an integral multiple thereof by a reciprocal of an integral multiple of the first natural number, the integral multiple of the first natural number being greater than or equal to 1, and a cycle control portion for outputting a second signal having first and second cycles included within a cycle of the first signal by controlling a cycle of the pixel clock, the first cycle corresponding to a quotient which, along with a remainder, results from the integral multiple of the first natural number divided by a third natural number equal to or different from the second natural number, the number of first cycles included within the cycle of the first signal corresponding to a first value for the third natural number minus the remainder, the second cycle corresponding to a second value for the quotient plus 1, the number of second cycles included within the cycle of the first signal corresponding to the remainder, the cycle control portion calculating a sum of remainders as necessary, and controlling the cycles of the second signal when the sum exceeds a threshold.

Still another aspect of the present invention is directed to a system for transmitting/receiving video and audio data, including a transmitter for transmitting a sampling frequency, a first natural number, and a second natural number, along with a pixel clock required for video data reproduction, the first natural number and the second natural number being a numerator and a denominator, respectively, in a rational relationship where a frequency of the pixel clock is divided by a frequency of an audio reference clock, and a receiver for receiving the pixel clock, the sampling frequency, the first natural number, and the second natural number transmitted by the transmitter, the receiver including a first frequency divider for outputting a first signal by dividing a signal with a frequency corresponding to the pixel clock or an integral multiple thereof by a reciprocal of an integral multiple of the first natural number, the integral multiple of the first natural number being greater than or equal to 1, and a cycle control portion for outputting a second signal having first and second cycles included within a cycle of the first signal by controlling a cycle of the pixel clock, the first cycle corresponding to a quotient which, along with a remainder, results from the integral multiple of the first natural number divided by a third natural number equal to or different from the second natural number, the number of first cycles included within the cycle of the first signal corresponding to a first value for the third natural number minus the remainder, the second cycle corresponding to a second value for the quotient plus 1, the number of second cycles included within the cycle of the first signal corresponding to the remainder, the cycle control portion calculating a sum of remainders as necessary, and controlling the cycles of the second signal when the sum exceeds a threshold.

Still another aspect of the present invention is directed to a semiconductor circuit includible in a receiver for use in a system with a transmitter transmitting a sampling frequency, a first natural number, and a second natural number to a receiver, along with a pixel clock required for video data reproduction, the first natural number and the second natural number being a numerator and a denominator, respectively, in a rational relationship where a frequency of the pixel clock is divided by a frequency of an audio reference clock, the circuit including a first frequency divider for outputting a first signal by dividing a signal with a frequency corresponding to the pixel clock or an integral multiple thereof by a reciprocal of an integral multiple of the first natural number, the integral multiple of the first natural number being greater than or equal to 1, and a cycle control portion for outputting a second signal having first and second cycles included within a cycle of the first signal by controlling a cycle of the pixel clock, the first cycle corresponding to a quotient which, along with a remainder, results from the integral multiple of the first natural number divided by a third natural number equal to or different from the second natural number, the number of first cycles included within the cycle of the first signal corresponding to a first value for the third natural number minus the remainder, the second cycle corresponding to a second value for the quotient plus 1, the number of second cycles included within the cycle of the first signal corresponding to the remainder, the cycle control portion calculating a sum of remainders as necessary, and controlling the cycles of the second signal when the sum exceeds a threshold.

Still another aspect of the present invention is directed to a macro for use in a semiconductor circuit includible in a receiver for use in a system with a transmitter transmitting a sampling frequency, a first natural number, and a second natural number to a receiver, along with a pixel clock required for video data reproduction, the first natural number and the second natural number being a numerator and a denominator, respectively, in a rational relationship where a frequency of the pixel clock is divided by a frequency of an audio reference clock, the macro including a first frequency divider for outputting a first signal by dividing a signal with a frequency corresponding to the pixel clock or an integral multiple thereof by a reciprocal of an integral multiple of the first natural number, the integral multiple of the first natural number being greater than or equal to 1, and a cycle control portion for outputting a second signal having first and second cycles included within a cycle of the first signal by controlling a cycle of the pixel clock, the first cycle corresponding to a quotient which, along with a remainder, results from the integral multiple of the first natural number divided by a third natural number equal to or different from the second natural number, the number of first cycles included within the cycle of the first signal corresponding to a first value for the third natural number minus the remainder, the second cycle corresponding to a second value for the quotient plus 1, the number of second cycles included within the cycle of the first signal corresponding to the remainder, the cycle control portion calculating a sum of remainders as necessary, and controlling the cycles of the second signal when the sum exceeds a threshold.

Still another aspect of the present invention is directed to a method for generating a desired audio reference clock for use on a receiver side in a system with a transmitter transmitting a sampling frequency, a first natural number, and a second natural number to a receiver, along with a pixel clock required for video data reproduction, the first natural number and the second natural number being a numerator and a denominator, respectively, in a rational relationship where a frequency of the pixel clock is divided by a frequency of an audio reference clock, the method including outputting a first signal by dividing a signal with a frequency corresponding to the pixel clock or an integral multiple thereof by a reciprocal of an integral multiple of the first natural number, the integral multiple of the first natural number being greater than or equal to 1, outputting a second signal having first and second cycles included within a cycle of the first signal by controlling a cycle of the pixel clock, the first cycle corresponding to a quotient which, along with a remainder, results from the integral multiple of the first natural number divided by a third natural number equal to or different from the second natural number, the number of first cycles included within the cycle of the first signal corresponding to a first value for the third natural number minus the remainder, the second cycle corresponding to a second value for the quotient plus 1, the number of second cycles included within the cycle of the first signal corresponding to the remainder, and calculating a sum of remainders as necessary when outputting the second signal, and controlling the cycles of the second signal when the sum exceeds a threshold.

Still another aspect of the present invention is directed to a frequency divider having provided thereto a pixel clock, a first natural number, and a second natural number, the divider including a first frequency divider for outputting a first signal by dividing a signal with a frequency corresponding to the pixel clock or an integral multiple thereof by a reciprocal of an integral multiple of the first natural number, the integral multiple of the first natural number being greater than or equal to 1, and a cycle control portion for outputting a second signal having first and second cycles included within a cycle of the first signal by controlling a cycle of the pixel clock, the first cycle corresponding to a quotient which, along with a remainder, results from the integral multiple of the first natural number divided by a third natural number equal to or different from the second natural number, the number of first cycles included within the cycle of the first signal corresponding to a first value for the third natural number minus the remainder, the second cycle corresponding to a second value for the quotient plus 1, the number of second cycles included within the cycle of the first signal corresponding to the remainder, the cycle control portion calculating a sum of remainders as necessary, and controlling the cycles of the second signal when the sum exceeds a threshold.

Still another aspect of the present invention is directed to a storage medium having stored therein a program executable on a computer device for use in a system with a transmitter transmitting a sampling frequency, a first natural number, and a second natural number to a receiver, along with a pixel clock required for video data reproduction, the first natural number and the second natural number being a numerator and a denominator, respectively, in a rational relationship where a frequency of the pixel clock is divided by a frequency of an audio reference clock, the program causing the computer device to divide a signal with a frequency corresponding to the pixel clock or an integral multiple thereof by a reciprocal of an integral multiple of the first natural number, the integral multiple of the first natural number being greater than or equal to 1, and control a cycle of the pixel clock such that first and second cycles are included within a cycle of the divided signal, the first cycle corresponding to a quotient which, along with a remainder, results from the integral multiple of the first natural number divided by a third natural number equal to or different from the second natural number, the number of first cycles included within the cycle of the divided signal corresponding to a first value for the third natural number minus the remainder, the second cycle corresponding to a second value for the quotient plus 1, the number of second cycles included within the cycle of the divided signal corresponding to the remainder, the computer device being caused to calculate a sum of remainders as necessary in preparation for controlling the cycle of the pixel clock, such that the cycle of the pixel clock is controlled when the sum exceeds a threshold.

The present invention may be realized by gate-level design through combination of program counters, arithmetic circuits, and flip-flops, by an RTL description in a hardware description language such as VHDL, by a sequencer using a state machine, or by a computer device, such as microcomputer, DSP, or CPU, reading a program stored in memory, which is programmed using any of various programming languages.

Hereinafter, effects of the present invention will be described. According to the present invention, the pixel clock can be divided by a reciprocal of the first natural number or a multiple thereof divided by the second natural number or the third natural number. For example, where the first natural number is CTS, and the second natural number is N, the frequency of the pixel clock is divided at a ratio of N/CTS. Also, where the third natural number is Ndiv, the frequency of the pixel clock is divided at a ratio of Ndiv/CTS. In addition, where the first natural number is CTS×a, the frequency of the pixel clock is divided at a ratio of N/(CTS×a), for example. Accordingly, a higher reference frequency can be obtained compared to conventional cases where a low-frequency reference signal is generated by dividing the frequency of the pixel clock at a ratio of 1/CTS. Thus, conventional problems are addressed, including difficulty in achieving an on-chip configuration, errors in test accuracy, and jitter in audio reference clocks. Furthermore, in the present invention, the sum of remainders is calculated as necessary, and the cycle of the pixel clock is controlled when the sum exceeds a threshold. Accordingly, noise generated when dividing the pixel clock can be rendered at high frequency, and therefore it is possible to readily remove the high frequency noise, and generate the audio reference clock with more accuracy. Also, the structure for controlling the cycle as mentioned above can be realized by combining existing programmable counters and arithmetic circuits, and therefore it is possible to provide the receiver, electronic device, system, semiconductor circuit, macro, and frequency divider of the present invention at low cost. Moreover, the structure as mentioned above can also be realized by a program for operating a computer device.

Also, in the present invention, the oscillating frequency of the voltage-controlled oscillator is set to be an integral multiple of desired frequencies, and therefore by using the second frequency divider having a properly adjustable dividing ratio, it becomes possible to easily generate a desired audio reference clock. In addition, by setting the oscillating frequency of the voltage-controlled oscillator to be a common multiple of desired frequencies, it becomes possible to narrow the lock range of the PLL circuit. Thus, it is possible to simplify the configuration of the PLL circuit.

Also, by using the third frequency divider, it becomes possible to slightly reduce the reference frequency, which facilitates design of the PLL circuit. The phase noise ratio increases with the reference frequency, and therefore by providing the third frequency divider, it becomes possible to reduce the phase noise ratio. Furthermore, by determining the denominator for the dividing ratio of the third frequency divider such that the frequency of the reference signal to be inputted to the PLL circuit is the greatest common divisor for desired frequencies, it becomes possible to minimize variations in the reference frequency. Note that in the case where the desired frequency fluctuates, information concerning the dividing ratio of the third frequency divider may be stored in memory so as to be correlated with information concerning the desired frequency, so that the third frequency divider can divide the second signal using an appropriate dividing ratio.

Also, even if the frequency of the pixel clock is less than twice the desired frequency, it is possible to generate a desired audio reference clock.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram schematically illustrating the relational expression where CTS is divided by N;

FIG. 6 is a diagram schematically illustrating a relational expression;

FIG. 7 is a table for values in the remainder latch 65, which are calculated with N=13 and the remainder transitioning from 0 to 12;

FIG. 8 is a table for values in the quotient latch 66, which are calculated with N=13 and the remainder transitioning from 0 to 12;

FIG. 16 is a table illustrating examples of the numerical values used for the receivers 1 to 8 according to the first to eighth embodiments;

FIG. 17 is a table showing Npostdiv that can be used with sampling frequency Fs and integer Z;

FIG. 18 is another table showing Npostdiv that can be used with sampling frequency Fs and integer Z;

DESCRIPTION OF THE PREFERRED EMBODIMENTS

Figure 19:
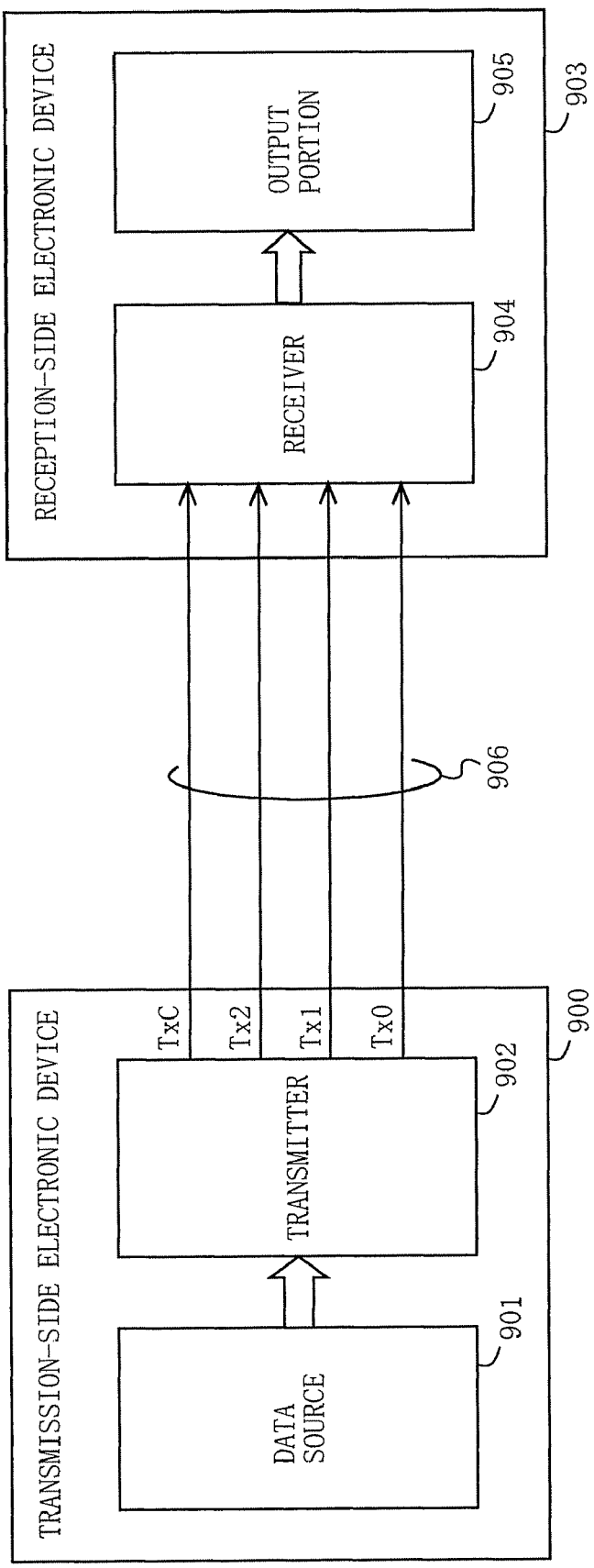
FIG. 19 is a block diagram illustrating a general system concept where data is transmitted from a transmission-side electronic device 900 to a reception-side electronic device 903.
Figure 20:
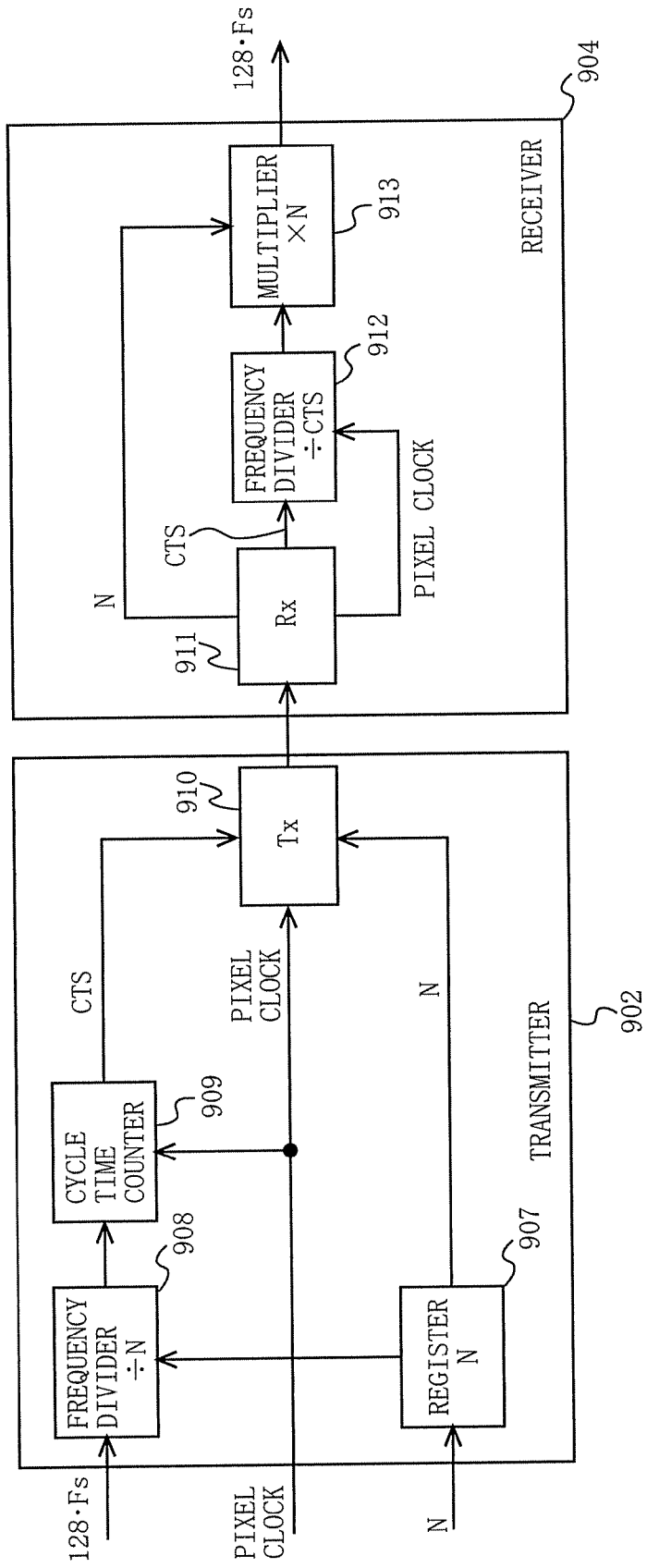
FIG. 20 is a block diagram illustrating features of a system according to the HDMI standard that are used for generating an audio reference clock required for audio data reproduction.
Figure 21:
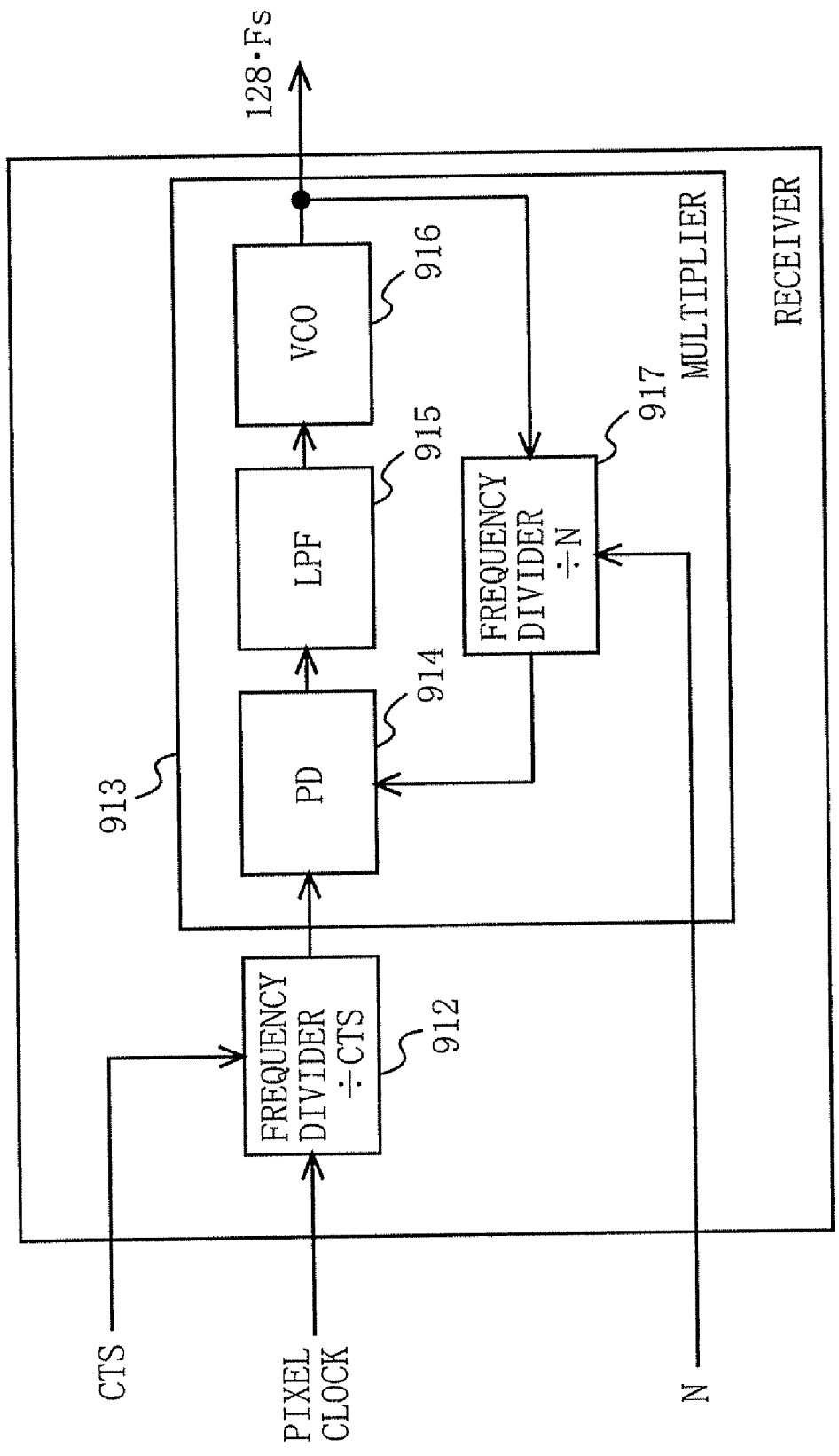
FIG. 21 is a block diagram illustrating a detailed functional configuration of a multiplier 913 in a receiver 904.

In preferred embodiments of the present invention, video and audio data is transmitted from the transmitter, along with a pixel clock, as shown in FIG. 19. Also, CTS and N are transmitted from the transmitter, as shown in FIG. 20. Furthermore, the sampling frequency Fs used in the transmitter is also transmitted from the transmitter to the receiver.

In preferred embodiments, the pixel clock frequency is represented as fTMDS_clock. The audio reference clock frequency used in the transmitter is represented as MCLK0. A desired audio reference clock frequency required by the receiver is represented as MCLK (referred to as a "desired frequency"). The receiver has stored therein information concerning MCLK. Here, MCLK0 and MCLK may be the same or may differ from each other. The audio reference clock frequencies MCLK0 and MCLK are integral multiples of the sampling frequency Fs. Specifically, MCLK0=Z×Fs, and MCLK=Z×Fs (where Z is an integer). Note that Z is typically a multiple of 128. Specifically, Z=128, 256, 384, 512, and so on. In another case, Z=4. Also, the sampling frequency Fs is typically selected from the group of integral multiples of 44.1 kHz or 48.0 kHz. For example, Fs=44.1 kHz, 88.2 kHz, or 176.4 kHz, or Fs=48.0 kHz, 96.0 kHz, 192.0 kHz, or 768.0 kHz. In another case, Fs=32.0 kHz.

When fTMDS_clock is divided by MCLK0, a rational relationship is established therebetween. That is, fTMDS_clock/MCLK0 can be represented in the form of a fraction. There are a plurality of patterns for the fractional representation. One fractional representation is selected such that the numerator and the denominator thereof are CTS and N, respectively. In preferred embodiments, CTS is referred to as a "first natural number". Also, N is referred to as a "second natural number". In some cases, fTMDS_clock and/or MCLK0 may be fixed or fluctuate dynamically. Accordingly, the transmission side counts the number of pixel clocks as necessary between cycles of an intermediate clock obtained by dividing the audio reference clock at a ratio of 1/N, and transmits the count to the reception side after calculation as CTS. Accordingly, CTS may be static or may vary dynamically. As can be appreciated from the CTS calculation method, fTMDS_clock is divisible by CTS. Note that such a method for transmitting CTS and N is merely an embodiment and is not intended to limit the present invention. That is, as for the receiver of the present invention, it is only necessary for CTS and N to be sent from the transmission side regardless of method. As for the system in preferred embodiments, it is only necessary for the relationship MCLK0=(fTMDS_clock×N)/CTS to be established. The receiver generates the audio reference clock using the pixel clock, CTS, N, and Fs, as well as information concerning MCLK being stored therein. On the basis of the foregoing, embodiments of the present invention will be described in concrete terms.

(First Embodiment)

Figure 1:
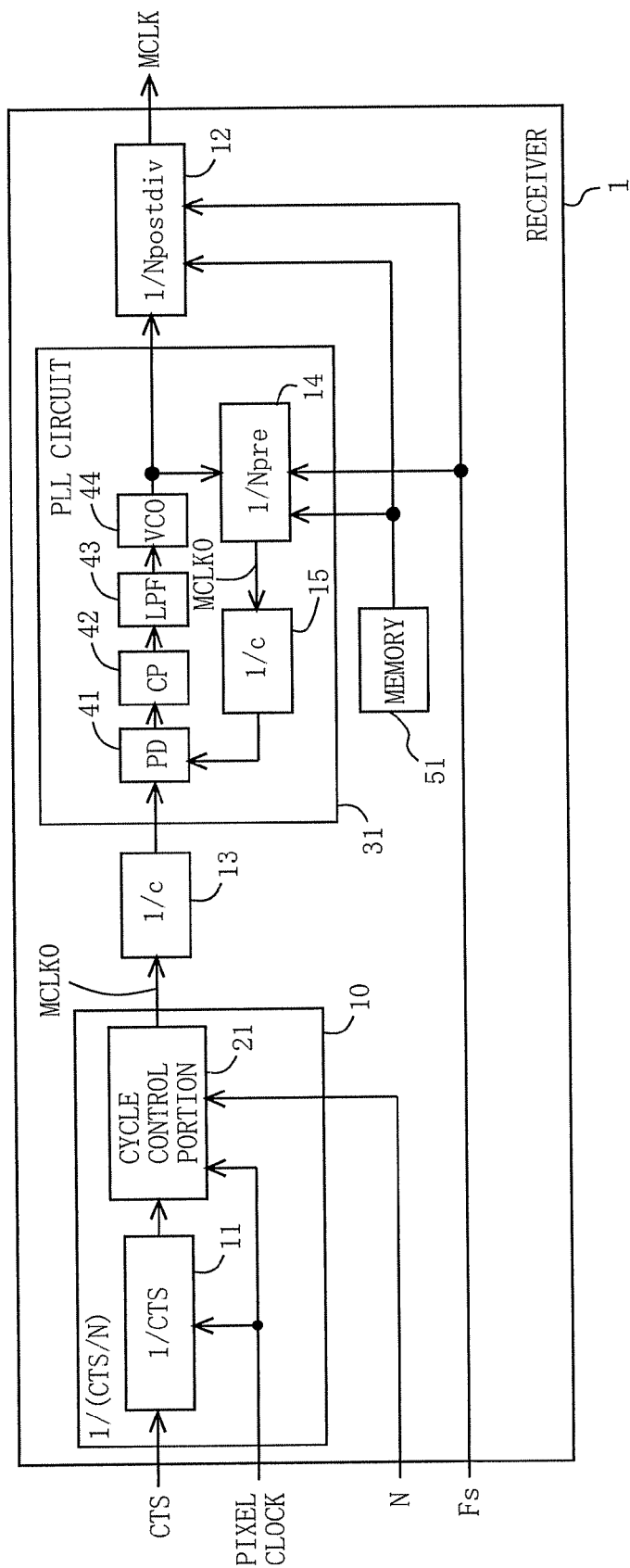
FIG. 1 is a block diagram illustrating the functional configuration of a receiver 1 according to a first embodiment of the present invention.

FIG. 1 is a block diagram illustrating the functional configuration of a receiver 1 according to a first embodiment of the present invention. In FIG. 1, the receiver 1 is provided with a first frequency divider 11, a second frequency divider 12, a third frequency divider 13, a cycle control portion 21, a PLL circuit 31, and a memory 51. The PLL circuit 31 includes a fourth frequency divider 14, a fifth frequency divider 15, a phase detector 41, a charge pump 42, a low-pass filter 43, and a voltage-controlled oscillator 44. The receiver 1 receives from the transmission side a first natural number CTS, a pixel clock, a second natural number N, and a sampling frequency Fs. The receiver 1 generates an audio reference clock with a frequency of MCLK based on the first natural number CTS, the pixel clock, the second natural number N, and the sampling frequency Fs.

First, the operation of the receiver will be outlined. The first frequency divider 11 divides the pixel clock at a dividing ratio of 1/CTS, and outputs a first signal with a frequency of fTMDS_clock/CTS.

The cycle control portion 21 outputs a second signal based on the first signal and pixel clock inputted thereto. The cycle control portion 21 controls the cycle of the pixel clock, thereby outputting the second signal. Where quotient CTSquo and remainder CTSrem are obtained by dividing the first natural number CTS by the second natural number N, the second signal has first and second cycles included within a cycle of the first signal, in which the first cycle corresponds to the quotient CTSquo, the number of first cycles included within the cycle of the first signal corresponds to a first value N−CTSrem for the second natural number N minus the remainder CTSrem, the second cycle corresponds to a second value CTSquo+1 for the quotient CTSquo plus 1, and the number of second cycles included within the cycle of the first signal corresponds to the remainder CTSrem. The cycle control portion 21 outputs the second signal such that the first cycle corresponding to the quotient CTSquo and the second cycle corresponding to the second value CTSquo+1 are diffused within the cycle of the first signal. Concretely, the cycle control portion 21 calculates the sum of remainders CTSrem as necessary, and outputs a signal having a cycle corresponding to the second value CTSquo+1 when the sum is greater than a threshold, while outputting a signal having a cycle corresponding to the quotient CTSquo when the sum is not greater than the threshold. With the functions of the first frequency divider 11 and the cycle control portion 21, the fractional frequency divider 10 is achieved as if it has a dividing ratio of 1/(CTS/N). Accordingly, the second signal outputted by the cycle control portion 21 has a higher frequency than conventional intermediate clock frequencies.

The third frequency divider 13 divides the second signal at a ratio of 1/c, thereby generating a reference signal to be inputted to the PLL circuit 31. Here, "c" is a value by which MCLK0 is divisible. The value of "c" allows the reference frequency not to be as excessively low as is conventional, and also facilitates design of the PLL circuit 31. Preferably, "c" may be determined such that the frequency of the reference signal to be inputted to the PLL circuit 13 is the greatest common divisor of desired frequencies MCLK. The third frequency divider 13 contributes to a reduction in the reference frequency.

The phase detector 41 compares the reference signal with a frequency division clock from the fifth frequency divider 15 in terms of phase, and provides an input to the charge pump 42. The charge pump 42 converts the pulse signal outputted by the phase detector 41 into current. The low-pass filter 43 converts the current from the charge pump 42 into voltage.

The voltage-controlled oscillator 44 uses the voltage from the low-pass filter 43 as control voltage, and outputs an oscillation signal with an oscillating frequency corresponding to the control voltage. The oscillating frequency VCOCLK of the voltage-controlled oscillator 44 is an integral multiple of the desired frequency MCLK, preferably a common multiple of frequencies MCLK of a plurality of audio reference clocks that can be requested on the receiver side. Since the sampling frequencies Fs are classified into groups of 44.1 kHz and 48.0 kHz, and Z is a multiple of 128, the oscillating frequencies VCOCLK of the voltage-controlled oscillator 44 are, for example, 589.824 MHz and 541.9008 MHz. That is, the voltage-controlled oscillator 44 is capable of generating oscillation frequencies corresponding to common multiples of multiples of the first frequency, i.e., 44.1 kHz, and the second frequency, i.e., 48.0 kHz. In this manner, by simply using, for example, 589.824 MHz and 541.9008 MHz as oscillating frequencies of the voltage-controlled oscillator 44, it becomes possible to generate conceivable frequencies MCLK. Accordingly, it is possible to narrow the lock range of the PLL circuit 31, so that the audio reference clock can be quickly generated at a desired frequency MCLK.

The fourth frequency divider 14 is a prescaler for dividing an output from the voltage-controlled oscillator. The dividing ratio of the fourth frequency divider 14 is 1/Npre. Here, Npre is a value by which the oscillating frequency VCOCLK is divisible. The value for the oscillating frequency VCOCLK divided by Npre is equal to MCLK0. Note that the aforementioned frequencies are illustrative, and it is only necessary for the voltage-controlled oscillator 44 to be capable of generating an oscillation frequency corresponding to a common multiple of the mutually different first and second frequencies. Besides, the dividing ratio of the fourth frequency divider 14 may be predetermined in accordance with multiples of the first and second frequencies.

The memory 51 has stored therein a table defining values for Npre so as to be correlated with information concerning Fs and MCLK (e.g., Z). Based on information concerning Fs and MCLK (e.g., Z) sent from the transmitter, the fourth frequency divider 14 references the table stored in the memory 51, and reads and divides Npre corresponding to a desired frequency MCLK. The information concerning MCLK is stored in the receiver 1. The path along which the information concerning MCLK is communicated to the fourth frequency divider 14 is omitted in FIG. 1 (the same shall apply hereinafter).

The fifth frequency divider 15, which has the same dividing ratio 1/c as the third frequency divider, divides a signal outputted by the fourth frequency divider 14, and inputs a frequency division clock to the phase detector 41.

The PLL circuit 31 inputs a phase-locked signal (referred to as a "third signal") to the second frequency divider 12. The second frequency divider 12 has a dividing ratio of 1/Npostdiv, and divides the output signal from the PLL circuit 31. Here, Npostdiv is a value for the oscillating frequency VCOCLK of the voltage-controlled oscillator divided by MCLK. Thus, the second frequency divider 12 can generate an audio reference clock with a conceivable frequency MCLK. The dividing ratio of the second frequency divider 12 is predetermined in accordance with multiples of 44.1 kHz and 48.0 kHz. The memory 51 has stored therein a table defining values for Npostdiv so as to be correlated with information concerning Fs and MCLK. Based on information concerning Fs and MCLK (e.g., Z) sent from the transmitter, the second frequency divider 12 references the table stored in the memory 51, reads Npostdiv corresponding to a desired frequency MCLK, and performs division while changing the value of Npostdiv as necessary. Thus, the second frequency divider 12 outputs an audio reference clock with a desired frequency MCLK.

Figure 2:
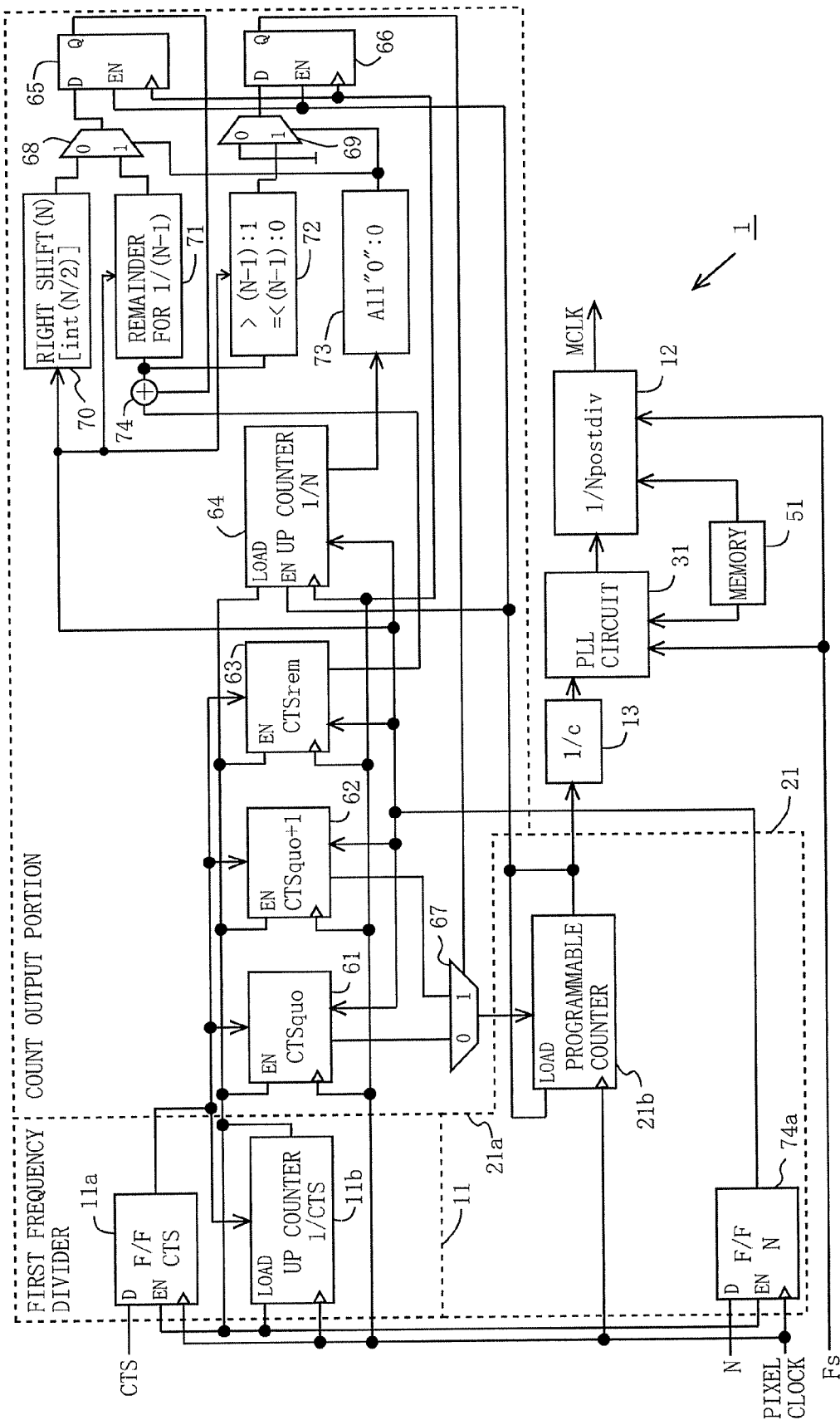
FIG. 2 is a block diagram of the receiver 1, illustrating detailed circuit configurations of a first frequency divider 11 and a cycle control portion 21.
Figure 3:
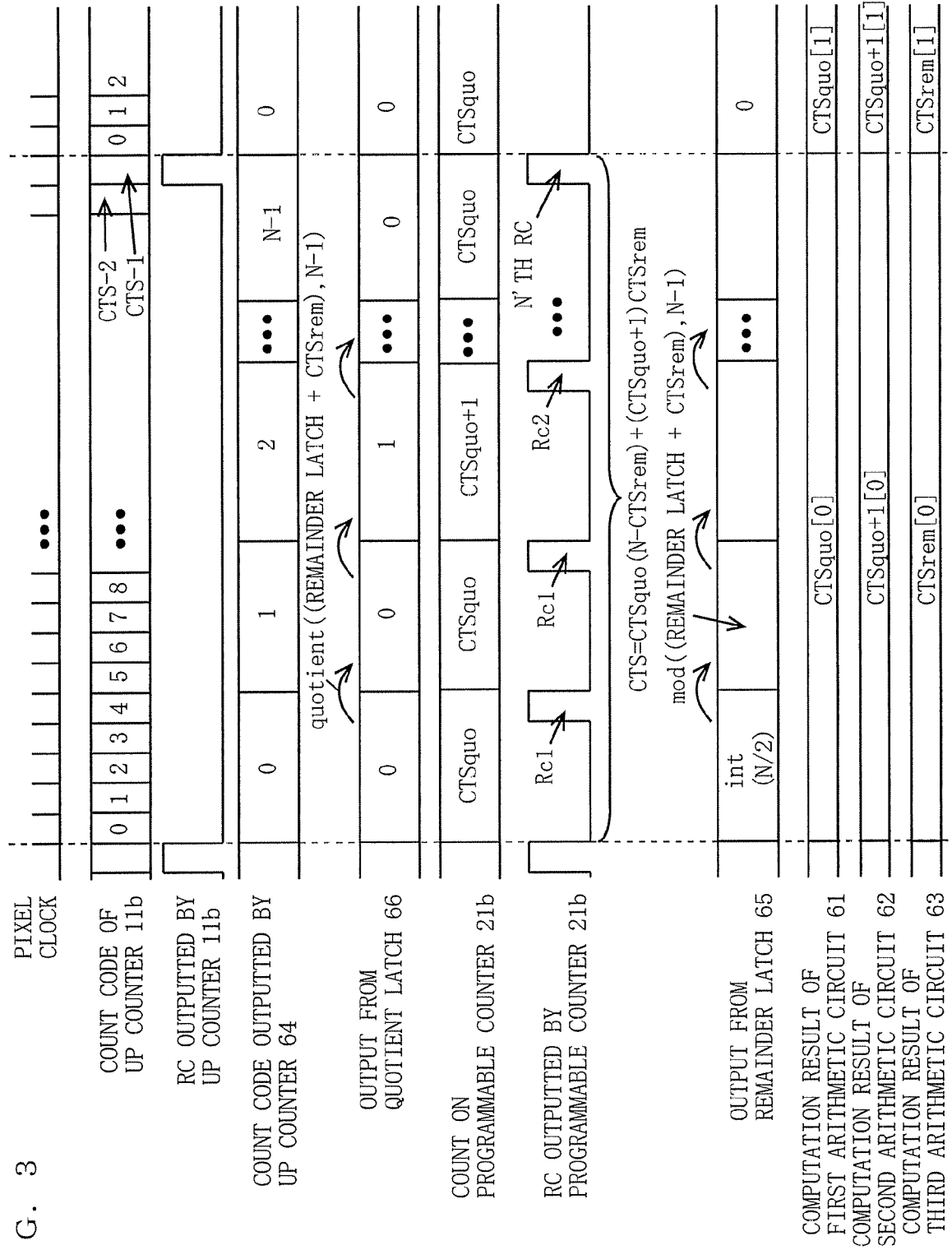
FIG. 3 is a timing chart illustrating exemplary operations in the first frequency divider 11 and the cycle control portion 21.

FIG. 2 is a block diagram of the receiver 1, illustrating detailed circuit configurations of the first frequency divider 11 and the cycle control portion 21. In FIG. 2, elements similar to those in FIG. 1 are denoted by the same reference numerals, and any descriptions thereof will be omitted. FIG. 3 is a timing chart illustrating exemplary operations in the first frequency divider 11 and the cycle control portion 21. Note that FIG. 3 leaves out any delay caused by latches and so on. Hereinafter, the operations of the first frequency divider 11 and the cycle control portion 21 will be described with reference to FIGS. 2 and 3.

In FIG. 2, the first frequency divider 11 includes a flip-flop 11a and an up counter 11b. The cycle control portion 21 includes a count output portion 21a, a programmable counter 21b, and a flip-flop 74a. The count output portion 21a includes a first arithmetic circuit 61, a second arithmetic circuit 62, a third arithmetic circuit 63, an up counter 64, a remainder latch 65, a quotient latch 66, multiplexers 67, 68, and 69, a divider circuit 70, a residue arithmetic circuit 71, a comparator circuit 72, a comparator circuit 73, and an adder circuit 74.

The flip-flop 11a latches CTS at the moment when the pixel clock rises. The flip-flop 11a outputs CTS, which is inputted to the up counter 11b, the first arithmetic circuit 61, the second arithmetic circuit 62, and the third arithmetic circuit 63. The up counter 11b is a programmable counter for adjusting the count in accordance with the value of CTS. The up counter 11b counts the pixel clock a number of times corresponding to CTS, and then outputs a ripple carry. In FIG. 3, a sequence from "0" to "CTS−1" is shown as a count code for the up counter 11b. It is also shown that the ripple carry is outputted by the up counter 11b via counting of CTS. The ripple carry outputted by the up counter 11b counting CTS is used as the first signal. The first signal is inputted to a load terminal of the up counter 11b, the flip-flop 11a, the flip-flop 74a, the first arithmetic circuit 61, the second arithmetic circuit 62, the third arithmetic circuit 63, and the up counter 64.

The flip-flop 11a outputs the CTS being latched, at the moment when the ripple carry rises as the first signal, and latches the next N. Note that in the timing chart shown in FIG. 3, the ripple carry has already risen as the first signal, and therefore the flip-flop 11a is assumed to have outputted the CTS. When CTS does not vary dynamically, the same CTS is always outputted by the flip-flop 11a. Conversely, when CTS varies dynamically, the latest CTS is outputted by the flip-flop 11a. The up counter 11b resets the count code at the moment when the ripple carry rises as the first signal, and starts counting. Accordingly, the up counter 11b outputs the first signal for the latest CTS.

The flip-flop 74a latches N at the moment when the pixel clock rises. The flip-flop 74a outputs the N being latched, at the moment when the ripple carry rises as the first signal, and latches the next N. Note that in the timing chart shown in FIG. 3, the ripple carry has already risen as the first signal, and therefore the flip-flop 74a is assumed to have outputted the N. When N does not vary dynamically, the same N is always outputted by the flip-flop 74a. Conversely, when N varies dynamically, the latest N is outputted by the flip-flop 74a. The N outputted by the flip-flop 74a is inputted to the first arithmetic circuit 61, the second arithmetic circuit 62, the third arithmetic circuit 63, the up counter 64, the divider circuit 70, the residue arithmetic circuit 71, and the comparator circuit 72.

The first arithmetic circuit 61 calculates and latches the quotient CTSquo for CTS divided by N in synchronization with the pixel clock. The second arithmetic circuit 62 calculates and latches CTSquo+1 for 1 plus the quotient CTSquo for CTS divided by N in synchronization with the pixel clock. The third arithmetic circuit 63 calculates and latches the remainder CTSrem for CTS divided by N. The computation result of the third arithmetic circuit 63 is inputted to the adder 74. In FIG. 3, if CTS and/or N does/do not vary dynamically, CTSquo[0], CTSquo+1[0], and CTSrem[0] are equal to CTSquo[1], CTSquo+1[1], and CTSrem[1], respectively. On the other hand, if CTS and/or N varies/vary dynamically, CTSquo[0], CTSquo+1[0], and CTSrem[0] might differ from CTSquo[1], CTSquo+1[1], and CTSrem[1], respectively. The first to third arithmetic circuits 61 to 63 have the output from the up counter 11*b* inputted to their enable terminals. Accordingly, when a ripple carry occurs in the output of the up counter 11*b*, the first to third arithmetic circuits 61 to 63 output their computation results being latched, and latch a result of an arithmetic computation using the next CTS and N. Note that in the timing chart shown in FIG. 3, the ripple carry has already risen as the first signal, and therefore the first to third arithmetic circuits 61 to 63 are assumed to have outputted their computation results.

The up counter 64 is a programmable counter for adjusting the count in accordance with the value of N. The up counter 64 counts the pixel clock a number of times corresponding to N. The up counter 64 increments the count code by one upon completion of each counting of N, and latches the count code. The up counter 64 has an output signal from the programmable counter 21*b* inputted to its enable terminal. Each time a ripple carry is inputted to the enable terminal, the up counter 64 outputs the count code being latched, which is inputted to the comparator circuit 73. Specifically, as shown in FIG. 3, the output from the up counter 64 is in synchronization with the ripple carry outputted by the programmable counter 21*b*. Upon reception of the ripple carry from the up counter 11*b* at the load terminal, the up counter 64 resets the count code, and outputs the count code "0", thereby restarting counting of N. Note that in the timing chart shown in FIG. 3, the ripple carry has already risen as the first signal, and therefore the up counter 11*b* is assumed to have started counting. As shown in FIG. 3, when the ripple carry from the up counter 11*b* is inputted, the count code of the up counter 64 is changed to "N−1". Note that in the case of using the architecture according to the first embodiment, CTS must be >2N. This is because if CTS≦2N, the ripple carry is inputted to the load terminal of the up counter 64 as the first signal before the next time N is counted after the ripple carry is inputted to the enable terminal of the up counter 64, failing to complete calculations by circuits connected downstream to the up counter 64.

When all bits in the count code outputted by the up counter 64 are "0" in binary indications, the comparator circuit 73 temporarily stores 0. On the other hand, when all bits in the count code outputted by the up counter 64 are not "0" in binary indications, the comparator circuit 73 temporarily stores 1.

The divider circuit 70 shifts the binary bit for N by one place to the right, thereby calculating the value for N divided by 2, and temporarily stores the value for N/2 with any digit after the decimal point being rounded off. The adder circuit 74 adds the remainder CTSrem outputted by the third arithmetic circuit 63 to the value being temporarily stored in the remainder latch 65, and inputs the resultant value to the residue arithmetic circuit 71 and the comparator circuit 73. The residue arithmetic circuit 71 calculates and temporarily stores the remainder for the value inputted from the adder circuit 74 divided by N−1. The comparator circuit 72 compares the value inputted from the adder circuit 74 with N−1, and temporarily stores 1 when the value inputted from the adder circuit 74 is greater than N−1, or 0 when less than or equal to N−1.

When the value being temporarily stored in the comparator circuit 73 is 0, the multiplexer 68 outputs the value being temporarily stored in the divider circuit 70, which is inputted to the remainder latch 65. On the other hand, when the value being temporarily stored in the comparator circuit 73 is 1, the multiplexer 68 outputs the value being temporarily stored in the residue arithmetic circuit 71, which is inputted to the remainder latch 65. Accordingly, as shown in FIG. 3, the value in the remainder latch is int(N/2) when the count code outputted by the up counter 64 is 0, and mod((remainder latch+CTSrem),N−1) when other than 0. Here, int(x) represents the value for x with any digit after the decimal point being rounded off. Represented by mod (x,y) is the remainder for x divided y. N−1 serves as a threshold for determining a value to be stored to the remainder latch 65. If calculating mod((remainder latch+CTSrem),N−1) causes the value for the remainder CTSrem plus the value being stored in the remainder latch 65 to exceed the threshold N−1, the overflow is stored to the remainder latch 65.

When the value being temporarily stored in the comparator circuit 73 is 0, the multiplexer 69 outputs 0, which is inputted to the quotient latch 66. On the other hand, when the value being temporarily stored in the comparator circuit 73 is 1, the multiplexer 69 outputs the value being temporarily stored in the comparator circuit 72, which is inputted to the quotient latch 66. Accordingly, as shown in FIG. 3, the value in the quotient latch is the quotient ((remainder latch+CTSrem),N−1). Here, quotient (x,y) represents the quotient for x divided by y. Accordingly, the value in the quotient latch 66 is 1 when the sum of the value in the remainder latch 65 and the remainder CTSrem exceeds the threshold N−1, or 0 when otherwise.

The remainder latch 65 operates in synchronization with the pixel clock, and each time the ripple carry from the programmable counter 21*b* is inputted to the enable terminal, the remainder latch 65 outputs the value being temporarily stored therein, which is inputted to the adder circuit 74. The quotient latch 66 operates in synchronization with the pixel clock, and each time the ripple carry from the programmable counter 21*b* is inputted to the enable terminal, the quotient latch 66 outputs the value being temporarily stored therein, which is inputted to the multiplexer 67.

The multiplexer 67 outputs as a count the quotient CTSquo arithmetically computed by the first arithmetic circuit 61 when the value inputted from the quotient latch 66 is 0, or the quotient CTSquo+1 arithmetically computed by the second arithmetic circuit 62 when the value inputted from the quotient latch 66 is 1, so that the count is inputted to the programmable counter 21*b*.

The programmable counter 21*b* counts the pixel clock based on the count inputted thereto. If the count is CTSquo, the programmable counter 21*b* makes a count a number of times corresponding to CTSquo, and generates a first ripple carry (indicated as Rc1 in FIG. 3), which is a signal having a cycle corresponding to CTSquo. If the count is CTSquo+1, the programmable counter 21*b* makes a count a number of times corresponding to CTSquo+1, and generates a second ripple carry (indicated as Rc2 in FIG. 3), which is a signal having a cycle corresponding to CTSquo+1. The ripple carry outputted by the programmable counter 21*b* is inputted to the third frequency divider 13 as a second signal. Because CTS=CTSquo×N+CTSrem=CTSquo×(N−CTSrem)+(CTSquo+1)×CTSrem, the number of ripple carries outputted by the programmable counter 21*b* is N. As can be appreciated from FIG. 3, within the cycle of the first signal outputted by the up counter 11*b*, the cycle corresponding to the value of CTSquo is included N−CTSrem times, and the cycle corresponding to the value of CTSquo+1 is included CTSrem times.

Figure 4:
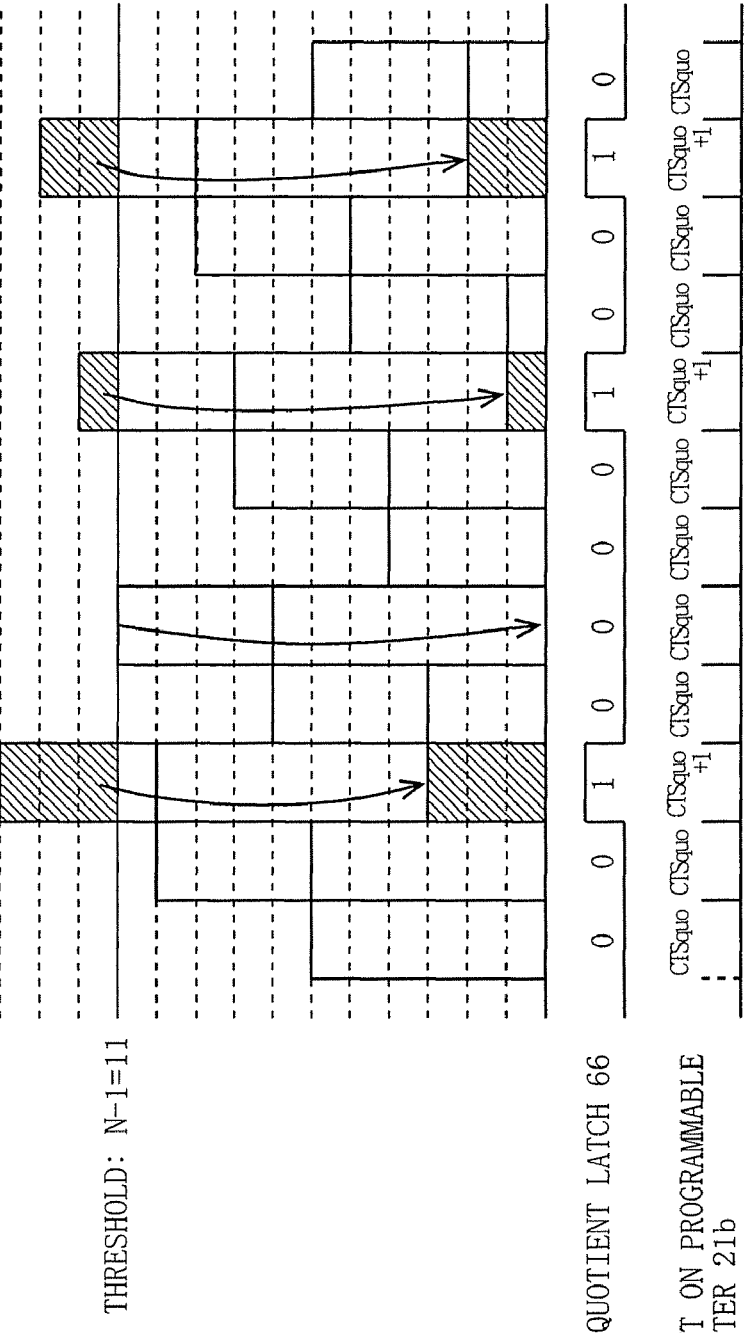
FIG. 4 is a diagram schematically illustrating changes in values stored in a remainder latch 65 and a quotient latch 66.

FIG. 4 is a diagram schematically illustrating changes in values stored in the remainder latch 65 and the quotient latch 66. In FIG. 4, for ease of understanding, N=12, and CTSrem=4. When the count code outputted by the up counter 64 is 0, the remainder latch 65 receives 6, which is the value of int (N/2). Thereafter, the remainder CTSrem is added to the remainder latch 65 upon each increase in the count code outputted by the up counter 64. For example, when the count code is 2, the value after addition is 13, and therefore the value in the remainder latch 65 is 3, which is an overflow over the threshold 11. In this case, the value in the quotient latch 11 is 1. Thus, the count on the programmable counter 21b transitions from CTSquo to CTSquo+1. As for the code value of the programmable counter 21b, it can be appreciated that CTSquo and CTSquo+1 are dispersed, as shown in FIG. 4. This is because the sum of remainders CTSrem is calculated as necessary, and the count on the programmable counter 21b is changed when the sum exceeds the threshold (here, N−1=11). By dispersing CTSquo and CTSquo+1, any components generated by switching between CTSquo and CTSquo+1 can be rendered at high frequency, thereby making it possible to readily remove the components by the low-pass filter 43.

The phenomenon where CTSquo and CTSquo+1 are dispersed will be described in some more detail. When dividing CTS by N, the relational expression CTS=CTSquo×N+CSTrem is established. FIG. 5 is a diagram schematically illustrating the relational expression where CTS is divided by N. Within the cycle of CTS, if N ripple carries, each having a cycle corresponding to CTSquo, are outputted, and a ripple carry having a cycle corresponding to CTSrem is outputted as the (N+1)'th one, a total of N+1 ripple carries are outputted. This cannot be considered as division at a dividing ratio of 1/(CTS/N).

The relational expression CTS=CTSquo×N+CSTrem can be converted into the relational expression CTS=CTSquo×(N−CTSrem)+(CTSquo+1)×CTSrem. FIG. 6 is a diagram schematically illustrating the relational expression after conversion. When ripple carries each having a cycle corresponding to CTSquo, the number of which corresponds to the first value N−CTSrem, are outputted, and ripple carries each having a cycle corresponding to the second value CTSquo+1, the number of which corresponds to the remainder CTSrem, are outputted, there are N ripple carries outputted. Accordingly, it is at least possible to consider the division to have been performed at a dividing ratio of CTS/N. However, if the ripple carries each having a cycle corresponding to the second value CTSquo+1 are concentrated during a certain period, the reference signal contains low-frequency components, which are difficult to remove. Accordingly, the ripple carries each having a cycle corresponding to the second value CTSquo+1 need to be dispersed. Therefore, in the present invention, the sum of remainders CTSrem is calculated as necessary, and a second ripple carry is outputted when the sum exceeds the threshold, so that the ripple carries each having a cycle corresponding to the second value CTSquo+1 are outputted in a dispersed manner.

Accordingly, within the cycle of the first signal, the count output portion 21a outputs the quotient CTSquo as a count a number of times corresponding to the first value N−CTSrem, and also outputs the second value CTSquo+1 as a count a number of times corresponding to the remainder CTSrem. Furthermore, the count output portion 21a adds the remainder CTSrem to the remainder latch 65 as necessary, and outputs as a count the value of quotient CTSquo when the value after addition is greater than or equal to the threshold N−1, or the second value CTSquo+1 when less than the threshold N−1.

FIG. 7 is a table for values in the remainder latch 65, which are calculated with N=13 and the remainder transitioning from 0 to 12. FIG. 8 is a table for values in the quotient latch 66, which are calculated with N=13 and the remainder transitioning from 0 to 12. In FIG. 8, when looking at a given remainder value, and focusing on transitioning quotient latch values arranged next thereto, it can be appreciated that 1 and 0 appear in a dispersed manner. For example, when looking at the remainder 5, it can be appreciated that the value in the remainder latch 66 transitions in a dispersed manner in the order: 0, 0, 1, 0, 1, 0, 1, 0, 0, 1, 0, 1, 0. Note that as the remainder increases in value, the occurrence ratio for 0 decreases (for example, see the case where the remainder is 12 or 11). However, it can be appreciated that although the occurrence ratio for 0 decreases, 0 occurs in a dispersed manner. Conversely, as the remainder increases in value, the occurrence ratio for 1 decreases (for example, see the case where the remainder is 1 or 2). However, it can be appreciated that although the occurrence ratio for 1 decreases, 1 occurs in a dispersed manner. In this manner, the sum of remainders is calculated as necessary, the value in the quotient latch 66 is changed each time the sum exceeds the threshold, and the cycle of the ripple carry is selected in accordance with the value in the quotient latch 66, so that any components generated by switching between CTSquo and CTSquo+1 can be rendered at high frequency.

In this manner, according to the first embodiment, the pixel clock is divided at a dividing ratio of 1/(CTS/N), rather than at dividing ratio of 1/CTS, and therefore the frequency of the signal outputted by the cycle control portion 21 can be rendered higher than conventionally. In the first embodiment, the third frequency divider 13 divides the second signal outputted by the cycle control portion 21 at a dividing ratio of 1/c, but "c" is a value by which MCLK0 is divisible and which allows the reference frequency not to be as excessively low as is conventional and also facilitates design of the PLL circuit 31. As shown in FIG. 16, which will be described later, for example, c=16. Accordingly, the frequency of the reference signal outputted by the third frequency divider 13 can also be rendered higher than conventionally. Thus, conventional problems are addressed, including difficulty in achieving an on-chip configuration, errors in test accuracy, and jitter in audio reference clocks.

Furthermore, in the first embodiment, the sum of remainders is calculated as necessary, and ripple carries with different cycles are generated when the sum exceeds the threshold, thereby achieving division at a dividing ratio of 1/(CTS/N). Accordingly, noise generated when dividing the pixel clock can be rendered at high frequency, and therefore it is possible to readily remove the high frequency noise, and generate the audio reference clock with more accuracy.

Also, in the first embodiment, the oscillating frequency VCOCLK of the voltage-controlled oscillator 44 is set to be a common multiple of desired frequencies MCLK, and therefore by using the second frequency divider 12 having a properly adjustable dividing ratio, it becomes possible to easily generate a desired audio reference clock. In addition, by setting the oscillating frequency VCOCLK of the voltage-controlled oscillator 44 to be a common multiple of desired frequencies MCLK, it becomes possible to narrow the lock range of the PLL circuit 31. Thus, it is possible to simplify the configuration of the PLL circuit 31.

The third frequency divider 13 contributes to a reduction in the reference frequency. The phase noise ratio increases with the reference frequency, and therefore by providing the third frequency divider 13, it becomes possible to reduce the phase noise ratio. Furthermore, by determining "c" such that the frequency of the reference signal to be inputted to the PLL circuit 13 is the greatest common divisor for desired frequencies MCLK, it becomes possible to minimize variations in the reference frequency. Note that in the case where the desired frequency MCLK fluctuates, information concerning "c" may be stored in the memory 51 so as to be correlated with information concerning MCLK, so that the third frequency divider 13 can divide the second signal using an appropriate value as "c".

Note that the fourth frequency divider 14, which is a prescaler, is provided for the fifth frequency divider 15 to limit the operating frequency, and therefore it is not an indispensable feature in the present invention.

Note that in the first embodiment, the count output portion 21a outputs the second value CTSquo+1 as a count when the quotient latch 66 holds 1, and also outputs the quotient CTSquo as a count when the quotient latch 66 holds 0. However, this may be reversal. That is, the count output portion 21a may output as a count the second value CTSquo+1 when the quotient latch 66 holds 0, and output the quotient CTSquo as a count when the quotient latch 66 holds 1. In such a case, there is no difference from the first embodiment, except that the multiplexer 67 operates in an opposite manner. With this variation, the cycle control portion 21 controls the cycle of the second signal when the sum of remainders exceeds a threshold. This reversal variation is also applicable to all of second to eighth embodiments to be described below.

(Second Embodiment)

In the case of using the configuration according to the first embodiment, CTS needs to be >2×N, and therefore the pixel clock frequency fTMDS_clock needs to be greater than twice the desired frequency MCLK. That is, fTMDS_clock needs to be >2×MCLK. Accordingly, when the configuration according to the first embodiment is used where fTMDS_clock=27.0 MHz, and MCLK=24.576 MHz, there is a possibility where a desired audio reference clock cannot be generated appropriately.

Figure 9:
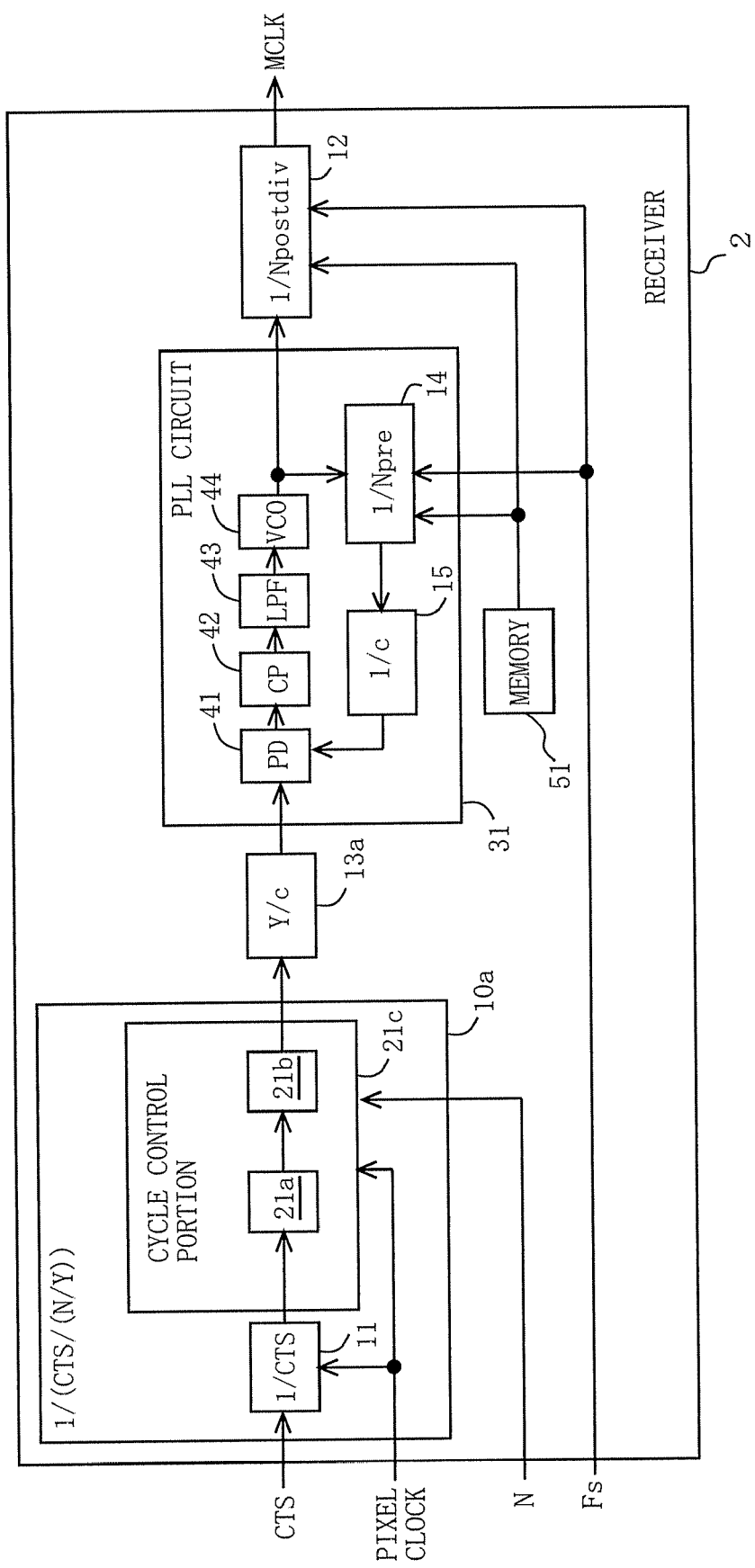
FIG. 9 is a block diagram illustrating the functional configuration of a receiver 2 according to a second embodiment of the present invention.

FIG. 9 is a block diagram illustrating the functional configuration of a receiver 2 according to the second embodiment of the present invention. In FIG. 9, elements having similar functions to those in the first embodiment are denoted by the same reference numerals, and any descriptions thereof will be omitted. Hereinafter, differences from the first embodiment will be mainly described.

As shown in FIG. 9, the receiver 2 is provided with a fractional frequency divider 10a, and a third frequency divider 13a. The fractional frequency divider 10a includes a cycle control portion 21c. The fractional frequency divider 10a performs division at a dividing ratio of 1/(CTS/(N/Y)). The third frequency divider 13a divides a signal outputted by the cycle control portion 21c at a dividing ratio of Y/c. Except for the foregoing, there is no difference from the first embodiment. Here, "Y" is a natural number by which N and c are divisible.

FIG. 2 is referenced to describe the operation of the cycle control portion 21c. The first to third arithmetic circuits 61 to 63 and the up counter 64 receive the value of N/Y, which serves as a third natural number. The first arithmetic circuit 61 outputs the quotient CTSquo for CTS/(N/Y). The second arithmetic circuit 62 outputs CTSquo+1, i.e., the quotient CTSquo for CTS/(N/Y) plus 1. The third arithmetic circuit 63 outputs the remainder CTSrem for CTS/(N/Y). The up counter 64 divides the pixel clock at a dividing ratio of 1/(N/Y). Within the cycle of the first signal, the program counter 21b outputs (N/Y) ripple carries, which are inputted to the third frequency divider 13a. Specifically, the cycle control portion 21c outputs the second signal in synchronization with the pixel clock being divided by a reciprocal of CTS/(N/Y) for the first natural number CTS divided by the third natural number N/Y for the second natural number N divided by the value Y by which N is divisible. In FIG. 9, MCLK0=fTMDS_clock/(CTS/(N/Y))×(Y/c)/(1/c), and therefore reduction of its fractions to a common denominator results in MCLK0=fTMDS_clock×N/CTS, as defined. Here, by setting N/Y to be a third natural number Ny, it becomes possible to select "Y" such that CTS>2×Ny even when CTS≦2×N.

Thus, the receiver 2 according to the second embodiment is useful in easing restrictions between fTMDS_clock and MCLK0 even when fTMDS_clock>2×MCLK, which makes it possible to generate a desired audio reference clock.

Note that the variation according to the second embodiment is applicable to all of the third through eighth embodiments to be described below.

(Third Embodiment)

Figure 10:
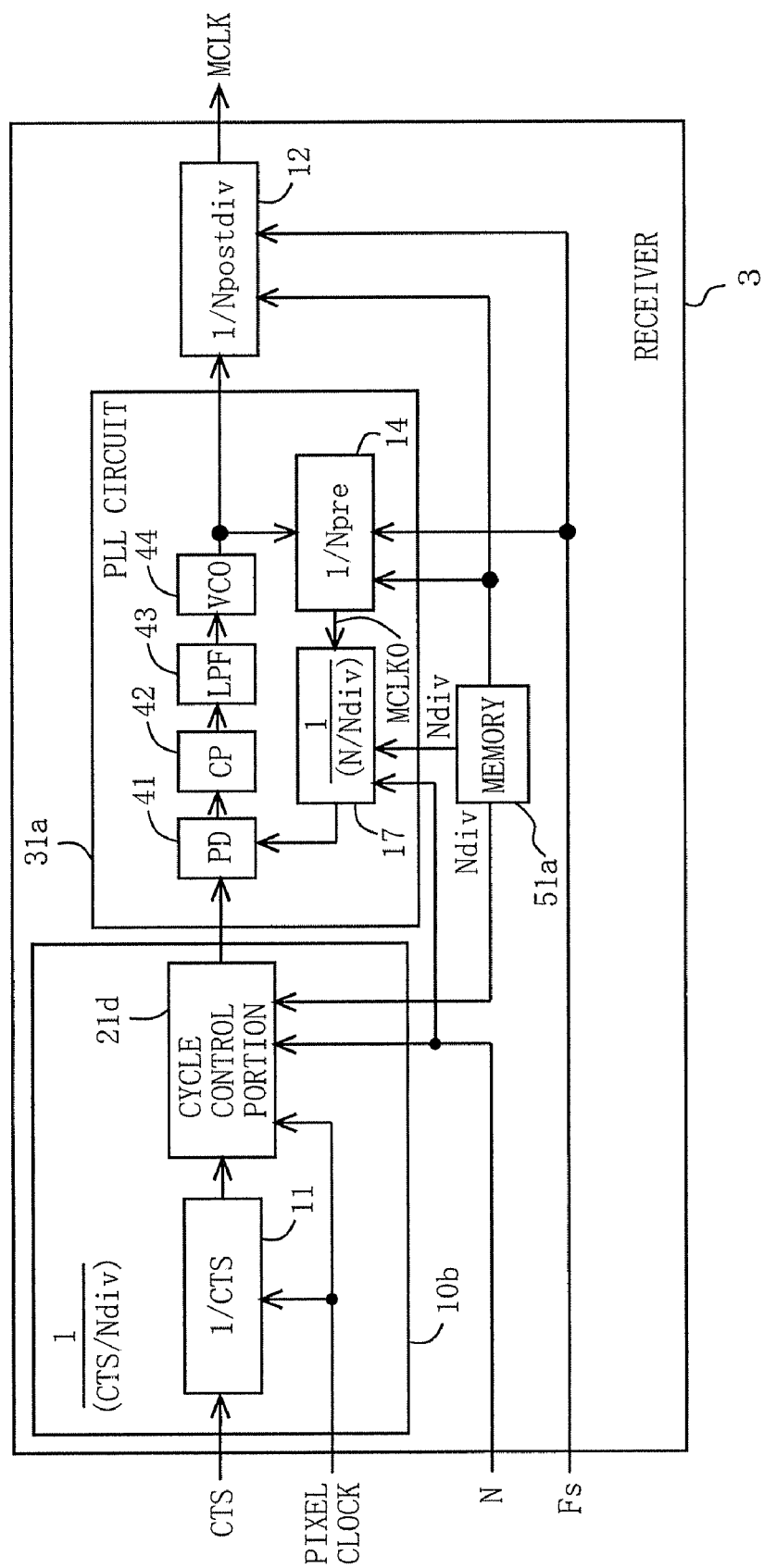
FIG. 10 is a block diagram illustrating the functional configuration of a receiver 3 according to a third embodiment of the present invention.

FIG. 10 is a block diagram illustrating the functional configuration of a receiver 3 according to the third embodiment of the present invention. In FIG. 10, elements having similar functions to those in FIG. 1 are denoted by the same reference numerals, and any descriptions thereof will be omitted. Hereinafter, differences from the first embodiment will be mainly described.

As shown in FIG. 10, the receiver 3 is provided with a fractional frequency divider 10b, a PLL circuit 31a, and a memory 51a. The fractional frequency divider 10b includes a cycle control portion 21d. The PLL circuit 31a includes a seventh frequency divider 17. The memory 51a has stored therein third natural numbers Ndiv by which N is divisible, so as to be correlated with MCLK. The cycle control portion 21d and the seventh frequency divider 17 read Ndiv corresponding to desired MCLK from the memory 51a. Here, Ndiv is a value by which N is divisible, and therefore the seventh frequency divider 17 does not have to be a fractional frequency divider, and may be a typical programmable counter.

The cycle control portion 21d performs arithmetical computations using Ndiv. Differences from the first embodiment will be described with reference to FIG. 2. First, located downstream of the flip-flop 74a is a circuit for arithmetically computing and temporarily storing the quotient N/Ndiv for N divided by Ndiv. The first to third arithmetic circuits 61 to 63, the up counter 64, the divider circuit 70, the residue arithmetic circuit 71, and the comparator circuit 72 receive N/Ndiv. The first to third arithmetic circuits 61 to 63, the up counter 64, the divider circuit 70, the residue arithmetic circuit 71, and the comparator circuit 72 each perform an arithmetical computation using N/Ndiv, instead of N. As a result, the cycle control portion 21d outputs a second signal having first and second cycles included within a cycle of the first signal, in which the first cycle corresponds to the quotient CTSquo which, along with the remainder CTSrem, results from the first natural number CTS divided by the third natural number Ndiv by which the second natural number N is divisible, the number of first cycles included within the cycle of the first signal corresponds to the first value Ndiv-CTSrem for the third natural number Ndiv minus the remainder CTSrem, the second cycle corresponds to the second value CTSquo+1, i.e., the quotient CTSquo plus 1, and second cycles included within the cycle of the first signal corresponds to the remainder CTSrem.

In this manner, the third natural number Ndiv different from the second natural number N may be used. The reference signal outputted by the cycle control portion 21d has a higher frequency than conventional reference signals, and therefore the third embodiment can achieve similar effects to those achieved by the first embodiment.

Note that the term "third natural number" as used in the Claims may encompass the second natural number.

(Fourth Embodiment)

Figure 11:
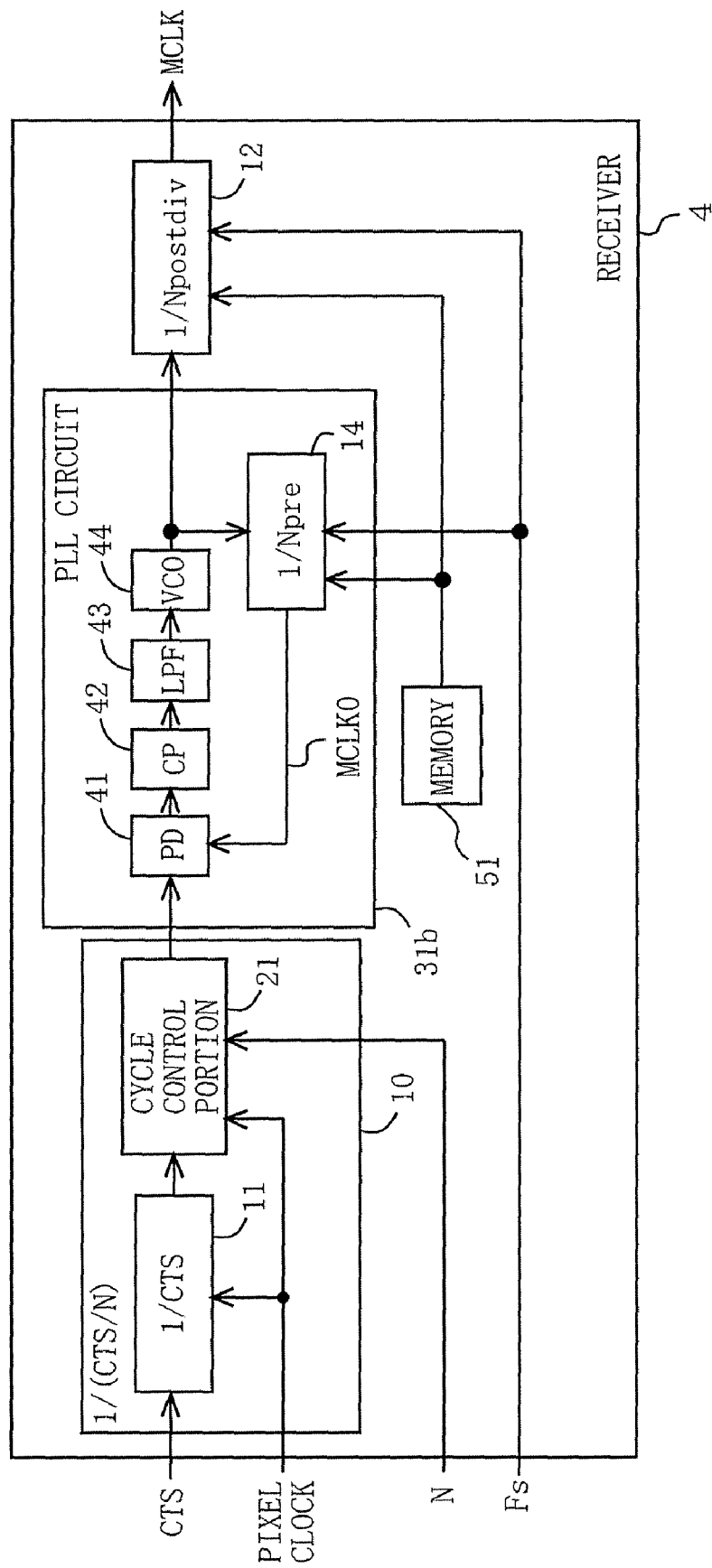
FIG. 11 is a block diagram illustrating the functional configuration of a receiver 4 according to a fourth embodiment of the present invention.

FIG. 11 is a block diagram illustrating the functional configuration of a receiver 4 according to the fourth embodiment of the present invention. In FIG. 11, elements having similar functions to those in the first embodiment are denoted by the same reference numerals, and any descriptions thereof will be omitted. Hereinafter, differences from the first embodiment will be mainly described.

In the fourth embodiment, unlike in the first embodiment, the third frequency divider 13 and the fifth frequency divider 15 are omitted, as shown in FIG. 11. The second signal outputted by the cycle control portion 21 is directly inputted to the PLL circuit 31b as a reference signal. The reference frequency is MCLK0. The dividing ratio used in the fourth frequency divider 14 is set such that MCLK0 can be achieved. As a result, the PLL circuit 31b can output a signal with a frequency of VCOCLK. As in the first embodiment, the second frequency divider 12 is used to generate an audio reference clock at a desired frequency MCLK.

In this manner, in the fourth embodiment also, the reference signal outputted by the cycle control portion 21 has a higher frequency than conventional reference signals, and therefore the fourth embodiment can achieve similar effects to those achieved by the first embodiment.

(Fifth Embodiment)

Figure 12:
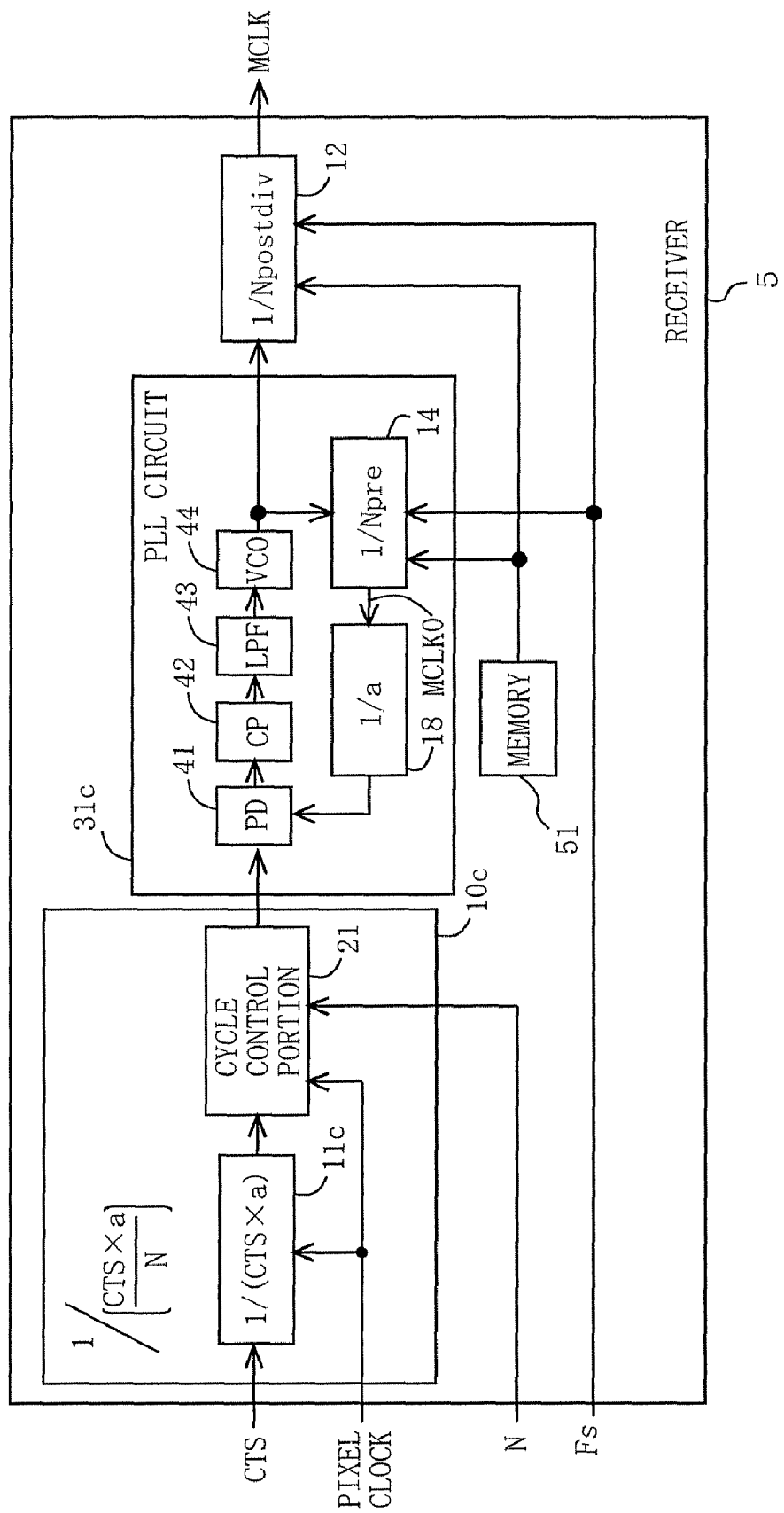
FIG. 12 is a block diagram illustrating the functional configuration of a receiver 5 according to a fifth embodiment of the present invention.

FIG. 12 is a block diagram illustrating the functional configuration of a receiver 5 according to the fifth embodiment of the present invention. In FIG. 12, elements having similar functions to those in the first embodiment are denoted by the same reference numerals, and any descriptions thereof will be omitted. Hereinafter, differences from the first embodiment will be mainly described.

In the fifth embodiment, unlike in the fourth embodiment, the first frequency divider 11c divides the pixel clock at a dividing ratio of 1/(CTS×a), as shown in FIG. 12. Here, "a" is an integer by which MCLK0 is divisible. A fractional frequency divider 10c can be seen as dividing the pixel clock at a dividing ratio of 1/((CTS×a)/N). An eighth frequency divider 18 divides a signal (with a frequency of MCLK0) outputted by the fourth frequency divider 14 at a dividing ratio of 1/a. As a result, a PLL circuit 31c can output a signal with a frequency of VCOCLK. As in the first embodiment, the second frequency divider 12 is used to generate an audio reference clock at a desired frequency MCLK.

In this manner, in the fifth embodiment also, the reference signal outputted by the cycle control portion 21 has a higher frequency than conventional reference signals, and therefore the fifth embodiment can achieve similar effects to those achieved by the first embodiment.

(Sixth Embodiment)

Figure 13:
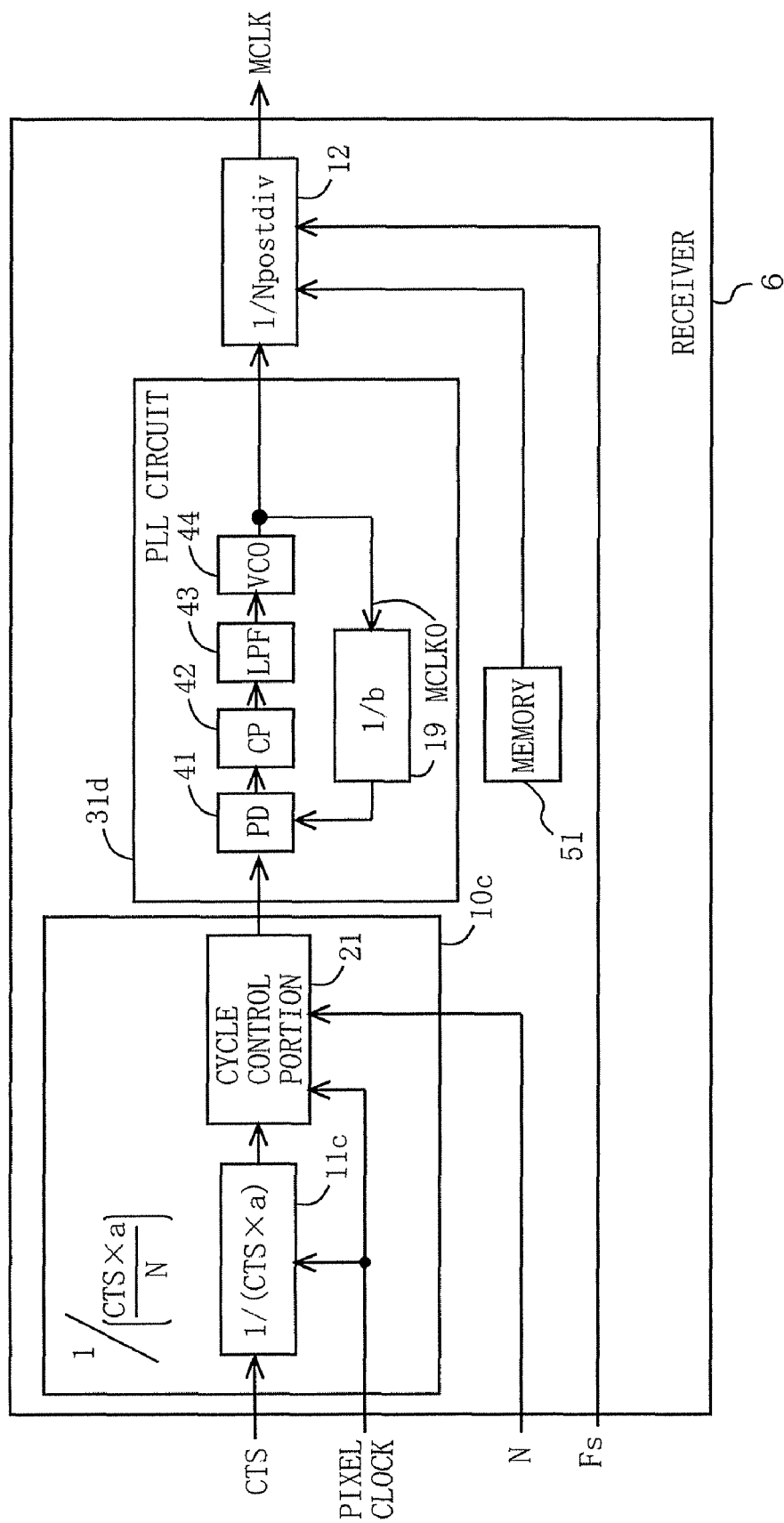
FIG. 13 is a block diagram illustrating the functional configuration of a receiver 6 according to a sixth embodiment of the present invention.

FIG. 13 is a block diagram illustrating the functional configuration of a receiver 6 according to the sixth embodiment of the present invention. In FIG. 13, elements having similar functions to those in the first and fifth embodiments are denoted by the same reference numerals, and any descriptions thereof will be omitted. Hereinafter, differences from the first and fifth embodiments will be mainly described.

A PLL circuit 31d includes a ninth frequency divider 19. Unlike in the fifth embodiment, the PLL circuit 31d does not include the fourth frequency divider 14. The ninth frequency divider 19 divides a signal outputted by the voltage-controlled oscillator 44 at a dividing ratio of 1/b. Here, "b" is a value by which VCOCKL is divisible, and also a multiple of "a". As a result, the PLL circuit 31d can output a signal with a frequency of VCOCLK. As in the first embodiment, the second frequency divider 12 is used to generate an audio reference clock at a desired frequency MCLK.

In this manner, in the sixth embodiment also, the reference signal outputted by the cycle control portion 21 has a higher frequency than conventional reference signals, and therefore the sixth embodiment can achieve similar effects to those achieved by the first embodiment.

(Seventh Embodiment)

Figure 14:
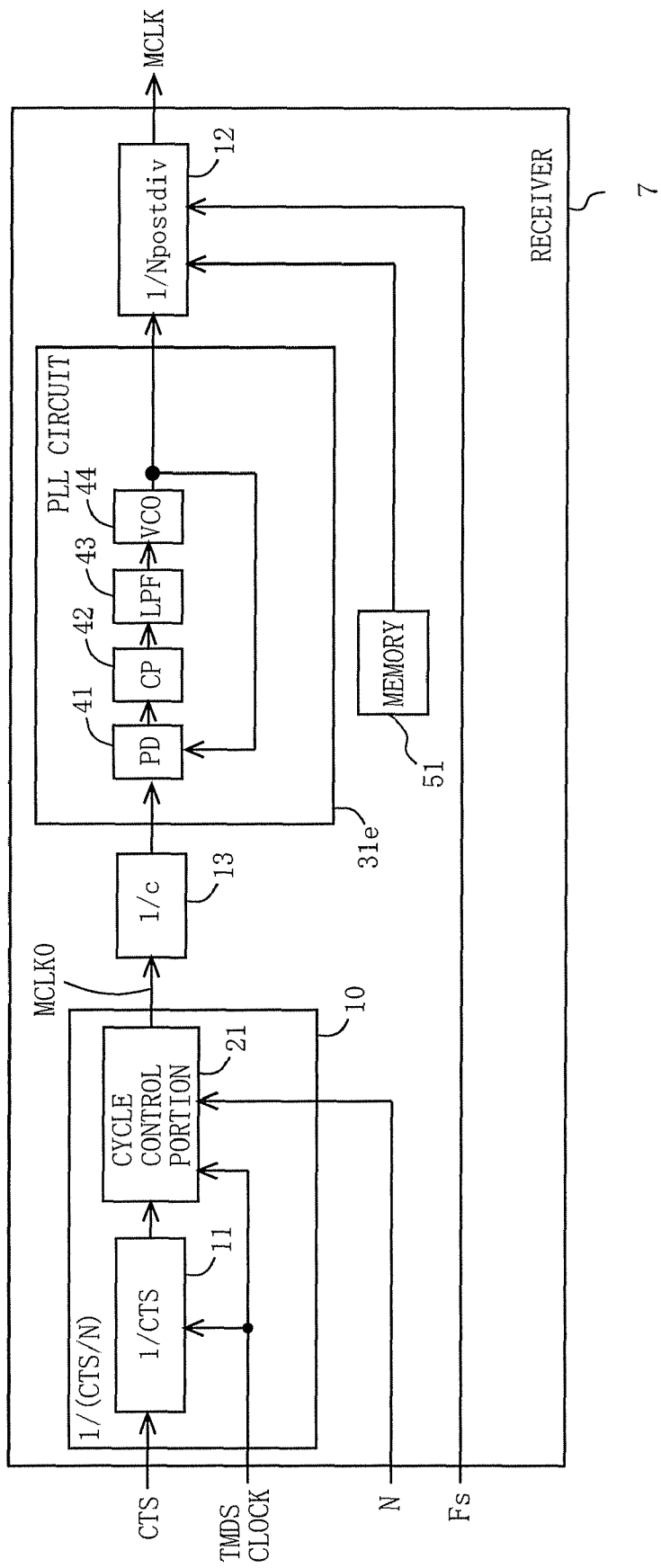
FIG. 14 is a block diagram illustrating the functional configuration of a receiver 7 according to a seventh embodiment of the present invention.

FIG. 14 is a block diagram illustrating the functional configuration of a receiver 7 according to the seventh embodiment of the present invention. In FIG. 14, elements having similar functions to those in the first embodiment are denoted by the same reference numerals, and any descriptions thereof will be omitted. Hereinafter, differences from the first embodiment will be mainly described.

Unlike in the first embodiment, a PLL circuit 31e does not include the fourth frequency divider 14 and the fifth frequency divider 15. The output from the voltage-controlled oscillator 44 is inputted to the phase detector without modification. In this manner also, the PLL circuit 31e can lock the frequency at VCOCLK.

(Eighth Embodiment)

Figure 15:
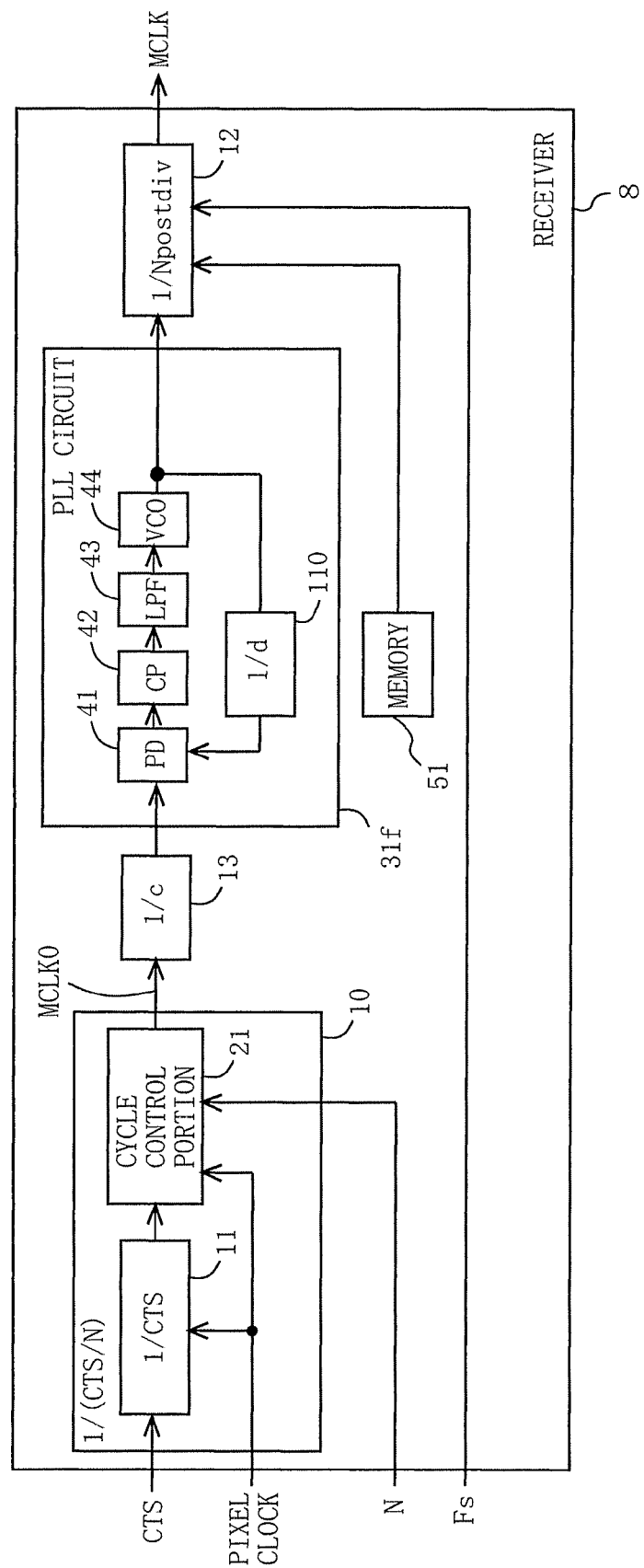
FIG. 15 is a block diagram illustrating the functional configuration of a receiver 8 according to an eighth embodiment of the present invention.

FIG. 15 is a block diagram illustrating the functional configuration of a receiver 8 according to the eighth embodiment of the present invention. In FIG. 15, elements having similar functions to those in the first embodiment are denoted by the same reference numerals, and any descriptions thereof will be omitted. Hereinafter, differences from the first embodiment will be mainly described.

A tenth frequency divider 110 divides a signal outputted by the voltage-controlled oscillator 44 at a dividing ratio of 1/d, and provides feedback. Here, "d" is a value by which VCOCLK is divisible. In this manner also, a PLL circuit 31f can lock the frequency at VCOCLK. As in the first embodiment, the second frequency divider 12 is used to generate an audio reference clock at a desired frequency MCLK.

In this manner, in the eighth embodiment also, the reference signal outputted by the third frequency divider 13 has a higher frequency than conventional reference signals, and therefore the eighth embodiment can achieve similar effects to those achieved by the first embodiment.

Note that in the above embodiments, the receiver may be incorporated in the reception-side electronic device. Also, in the above embodiments, the receiver may be incorporated in a system for transmitting/receiving video and audio data. Also, in the above embodiments, the receiver may be provided as a semiconductor circuit using any well-known means. Also, in the above embodiments, the receiver may be provided as a macro for use in semiconductor design. Also, in the above embodiments, the method employed by the receiver for generating an audio reference clock may be executed by hardware and/or software means within the system. Also, the device including the cycle control portion, as used in the above embodiments, can itself be provided as a frequency divider capable of calculating the sum of remainders as necessary and outputting either the first or second ripple carry when the sum exceeds a threshold.

Note that the present invention may be realized by gate-level design through combination of program counters, arithmetic circuits, and flip-flops, by an RTL description in a hardware description language such as VHDL, by a sequencer using a state machine, or by a computer device, such as microcomputer, DSP, or CPU, reading a program stored in memory, which is programmed using any of various programming languages.

Note that in all of the above embodiments, the PLL circuit is provided in the receiver, but in some cases, a signal outputted by the cycle control portion has a frequency of MCLK0, and can be used if jitter characteristics are not concerns, and therefore the PLL circuit is not an indispensable feature in the present invention. Also, even if the signal outputted by the frequency control portion does not have a frequency of MCLK0, in some cases, the signal outputted by the frequency control portion can be used, and therefore in such cases also, the PLL circuit is not an indispensable feature.

Note that in all of the above embodiments, the signal inputted to the first frequency divider is a pixel clock. However, since the relationship MCLK0=(fTMDS_clock×N)/CTS is established, even if a signal with a frequency corresponding to an integral multiple of the pixel clock is inputted to the first frequency divider, the receiver according to any of the above embodiments operates in the manner as described above, so that an audio reference clock at a desired frequency can be outputted. For example, referring to FIG. 3, even if the frequency of the pixel clock is integrally multiplied, the output from the up counter 11b can be sufficient for counting of a period of CTS. Accordingly, it is apparent that even if a signal with a frequency corresponding to an integral multiple of the pixel clock is inputted to the first frequency divider, the receiver operates appropriately.

NUMERICAL EXAMPLES

FIG. 16 is a table illustrating examples of the numerical values used for the receivers 1 to 8 according to the first to eighth embodiments. FIGS. 17 and 18 are tables showing Npostdiv that can be used with the sampling frequency Fs and the integer Z (i.e., MCLK). FIG. 17 shows Npostdiv for the group of 48.0 kHz. FIG. 18 shows Npostdiv for the group of 44.1 kHz. As shown in FIGS. 16 to 18, it is apparent that each embodiment provides a receiver capable of generating conceivable frequencies MCLK by setting VCOCLK at 589.824 MHz or 541.9008 MHz, so long as an appropriate dividing ratio is used.

While the invention has been described in detail, the foregoing description is in all aspects illustrative and not restrictive. It is understood that numerous other modifications and variations can be devised without departing from the scope of the invention.

What is claimed is:

1. A receiver for use in a system with a transmitter transmitting a sampling frequency, a first natural number, and a second natural number to a receiver, along with a pixel clock required for video data reproduction, the first natural number and the second natural number being a numerator and a denominator, respectively, in a rational relationship where a frequency of the pixel clock is divided by a frequency of an audio reference clock, the receiver comprising:

a first frequency divider for outputting a first signal by dividing a signal with a frequency corresponding to the pixel clock or an integral multiple thereof by a reciprocal of an integral multiple of the first natural number, the integral multiple of the first natural number being greater than or equal to 1; and a cycle control portion for outputting a second signal having first and second cycles included within a cycle of the first signal by controlling a cycle of the pixel clock, the first cycle corresponding to a quotient which, along with a remainder, results from the integral multiple of the first natural number divided by a third natural number equal to or different from the second natural number, the number of first cycles included within the cycle of the first signal corresponding to a first value for the third natural number minus the remainder, the second cycle corresponding to a second value for the quotient plus 1, the number of second cycles included within the cycle of the first signal corresponding to the remainder, wherein, the cycle control portion calculates a sum of remainders as necessary, and controls the cycles of the second signal when the sum exceeds a threshold.

2. The receiver according to claim 1, wherein the cycle control portion includes:

a count output portion for outputting the quotient as a count a number of times corresponding to the first value, and also outputting the second value as a count a number of times corresponding to the remainder; and a programmable counter for counting the counts outputted by the count output portion, and controlling the cycle of the pixel clock.

3. The receiver according to claim 2, wherein the count output portion performs:

sequential addition of the remainder to a latch;

output of the quotient as the count when the value after addition is greater than or equal to the threshold; and output of the second value as the count when the value after addition is less than the threshold.

4. The receiver according to claim 3, wherein, the count output portion includes:

a first arithmetic circuit for calculating the quotient;

a second arithmetic circuit for calculating the second value;

a third arithmetic circuit for calculating the remainder;

a counter for repeatedly counting the third natural number between ripple carries in the first signal outputted by the first frequency divider;

a remainder latch;

a quotient latch; and a multiplexer for selecting as the count an output from the first or second arithmetic circuit in accordance with a value in the quotient latch, the remainder latch holds:

a value for the third natural number divided by 2 with any digit after the decimal point being rounded off when the third natural number is initially counted by the counter; and a remainder for a third value divided by the threshold when the third natural number is counted by the counter but not when the third natural number is initially counted, the third value resulting from a value held in the remainder latch added to the remainder calculated by the third arithmetic circuit, the quotient latch holds a quotient for the third value divided by the threshold, and the multiplexer selects an output from the second arithmetic circuit when the value held in the quotient latch is 1, and an output from the first arithmetic circuit when the value held in the quotient latch is other than 1.

5. The receiver according to claim 2, wherein the count output portion performs:

addition of the remainder to a latch;

output of the second value as the count when the value after addition is greater than or equal to the threshold; and output of the quotient as the count when the value after addition is less than the threshold.

6. The receiver according to claim 5, wherein, the count output portion includes:

a first arithmetic circuit for calculating the quotient;

a second arithmetic circuit for calculating the second value;
a third arithmetic circuit for calculating the remainder;
a counter for repeatedly counting the third natural number between ripple carries in the first signal outputted by the first frequency divider;
a remainder latch;
a quotient latch; and
a multiplexer for selecting as the count an output from the first or second arithmetic circuit in accordance with a value in the quotient latch,
the remainder latch holds:
a value for the third natural number divided by 2 with any digit after the decimal point being rounded off when the third natural number is initially counted by the counter; and
a remainder for a third value divided by the threshold when the third natural number is counted by the counter but not when the third natural number is initially counted, the third value resulting from a value held in the remainder latch added to the remainder calculated by the third arithmetic circuit,
the quotient latch holds a quotient for the third value divided by the threshold, and
the multiplexer selects an output from the first arithmetic circuit when the value held in the quotient latch is 1, and an output from the second arithmetic circuit when the value held in the quotient latch is other than 1.

7. The receiver according to claim 1, further comprising:
a PLL circuit for outputting a signal locked at a desired frequency based on a reference signal obtained from the second signal outputted by the cycle control portion, wherein the PLL circuit includes a voltage-controlled oscillator oscillating at a frequency corresponding to an integral multiple of a desired frequency obtained by integrally multiplying the sampling frequency; and
a second frequency divider provided downstream of the PLL circuit for outputting a signal at the desired frequency by dividing a third signal outputted by the PLL circuit.

8. The receiver according to claim 7, wherein,
the voltage-controlled oscillator oscillates at a frequency corresponding to a common multiple of a plurality of desired frequencies, and
the second frequency divider switches between dividing ratios in accordance with the desired frequencies.

9. The receiver according to claim 8, wherein,
the voltage-controlled oscillator is capable of oscillating at a frequency corresponding to a common multiple of mutually different first and second frequencies, and
the dividing ratios are predetermined in accordance with multiples of the first and second frequencies.

10. The receiver according to claim 7, wherein,
the third natural number is equal to the second natural number, and
the first frequency divider divides the transmitted clock by a reciprocal of the first natural number.

11. The receiver according to claim 10, further comprising a third frequency divider for outputting the reference signal by dividing the second signal outputted by the cycle control portion.

12. The receiver according to claim 11, wherein the PLL circuit includes:
a fourth frequency divider for dividing a signal outputted by the voltage-controlled oscillator; and
a fifth frequency divider for dividing and feeding back a signal outputted by the fourth frequency divider, the signal being divided at a dividing ratio equal to a dividing ratio of the third frequency divider.

13. The receiver according to claim 7, wherein,
the first frequency divider divides the pixel clock by a reciprocal of the first natural number, and
the cycle control portion divides the pixel clock by a reciprocal of the first natural number divided by a value by which the second natural number is divisible, and outputs the second signal in synchronization with the pixel clock being divided.

14. The receiver according to claim 7, wherein,
the third natural number is a value by which the second natural number is divisible,
the first frequency divider divides the transmitted clock by a reciprocal of the first natural number,
the second signal outputted by the cycle control portion is used as a reference signal to be inputted to the PLL circuit, and
the PLL circuit includes:
a fourth frequency divider for dividing a signal outputted by the voltage-controlled oscillator; and
a seventh frequency divider for dividing and feeding back a signal outputted by the fourth frequency divider, the signal being divided by a reciprocal of a quotient for the second natural number divided by the third natural number.

15. The receiver according to claim 7, wherein,
the third natural number is equal to the second natural number,
the second signal outputted by the cycle control portion is used as a reference signal to be inputted to the PLL circuit, and
the PLL circuit includes a fourth divider circuit for dividing and feeding back a signal outputted by the voltage-controlled oscillator.

16. The receiver according to claim 7, wherein,
the third natural number is equal to the second natural number,
the second signal outputted by the cycle control portion is used as a reference signal to be inputted to the PLL circuit,
the first frequency divider divides the pixel clock by a reciprocal of the first natural number multiplied by a, where a is an integer of 2 or more, and
the PLL circuit includes:
a fourth frequency divider for dividing a signal outputted by the voltage-controlled oscillator; and
an eighth frequency divider for dividing and feeding back a signal outputted by the fourth frequency divider, the signal being divided by $1/a$.

17. The receiver according to claim 7, wherein,
the third natural number is equal to the second natural number,
the second signal outputted by the cycle control portion is used as a reference signal to be inputted to the PLL circuit,
the first frequency divider divides the pixel clock by a reciprocal of the first natural number divided by a, where a is an integer of 2 or more, and
the PLL circuit includes a ninth frequency divider for dividing and feeding back a signal outputted by the voltage-controlled oscillator, the signal being divided by $1/b$, where b is a multiple of a.

18. The receiver according to claim 7, wherein,
the third natural number is equal to the second natural number, and the PLL circuit feeds back a signal outputted by the voltage-controlled oscillator, thereby locking an oscillating frequency.

19. The receiver according to claim 7, wherein,
the third natural number is equal to the second natural number, and
the PLL circuit includes a tenth frequency divider for dividing and feeding back a signal outputted by the voltage-controlled oscillator, the signal being divided by 1/d.

20. A reception-side electronic device for use in a system with a transmission-side electronic device transmitting a sampling frequency, a first natural number, and a second natural number to a reception-side electronic device, along with a pixel clock required for video data reproduction, the first natural number and the second natural number being a numerator and a denominator, respectively, in a rational relationship where a frequency of the pixel clock is divided by a frequency of an audio reference clock, the reception-side electronic device comprising:
a first frequency divider for outputting a first signal by dividing a signal with a frequency corresponding to the pixel clock or an integral multiple thereof by a reciprocal of an integral multiple of the first natural number, the integral multiple of the first natural number being greater than or equal to 1; and
a cycle control portion for outputting a second signal having first and second cycles included within a cycle of the first signal by controlling a cycle of the pixel clock, the first cycle corresponding to a quotient which, along with a remainder, results from the integral multiple of the first natural number divided by a third natural number equal to or different from the second natural number, the number of first cycles included within the cycle of the first signal corresponding to a first value for the third natural number minus the remainder, the second cycle corresponding to a second value for the quotient plus 1, the number of second cycles included within the cycle of the first signal corresponding to the remainder, wherein,
the cycle control portion calculates a sum of remainders as necessary, and controls the cycles of the second signal when the sum exceeds a threshold.

21. A system for transmitting/receiving video and audio data, comprising:
a transmitter for transmitting a sampling frequency, a first natural number, and a second natural number, along with a pixel clock required for video data reproduction, the first natural number and the second natural number being a numerator and a denominator, respectively, in a rational relationship where a frequency of the pixel clock is divided by a frequency of an audio reference clock; and
a receiver for receiving the pixel clock, the sampling frequency, the first natural number, and the second natural number transmitted by the transmitter, wherein,
the receiver includes:
a first frequency divider for outputting a first signal by dividing a signal with a frequency corresponding to the pixel clock or an integral multiple thereof by a reciprocal of an integral multiple of the first natural number, the integral multiple of the first natural number being greater than or equal to 1; and
a cycle control portion for outputting a second signal having first and second cycles included within a cycle of the first signal by controlling a cycle of the pixel clock, the first cycle corresponding to a quotient which, along with a remainder, results from the integral multiple of the first natural number divided by a third natural number equal to or different from the second natural number, the number of first cycles included within the cycle of the first signal corresponding to a first value for the third natural number minus the remainder, the second cycle corresponding to a second value for the quotient plus 1, the number of second cycles included within the cycle of the first signal corresponding to the remainder, and
the cycle control portion calculates a sum of remainders as necessary, and controls the cycles of the second signal when the sum exceeds a threshold.

22. A semiconductor circuit includible in a receiver for use in a system with a transmitter transmitting a sampling frequency, a first natural number, and a second natural number to a receiver, along with a pixel clock required for video data reproduction, the first natural number and the second natural number being a numerator and a denominator, respectively, in a rational relationship where a frequency of the pixel clock is divided by a frequency of an audio reference clock, the circuit comprising:
a first frequency divider for outputting a first signal by dividing a signal with a frequency corresponding to the pixel clock or an integral multiple thereof by a reciprocal of an integral multiple of the first natural number, the integral multiple of the first natural number being greater than or equal to 1; and
a cycle control portion for outputting a second signal having first and second cycles included within a cycle of the first signal by controlling a cycle of the pixel clock, the first cycle corresponding to a quotient which, along with a remainder, results from the integral multiple of the first natural number divided by a third natural number equal to or different from the second natural number, the number of first cycles included within the cycle of the first signal corresponding to a first value for the third natural number minus the remainder, the second cycle corresponding to a second value for the quotient plus 1, the number of second cycles included within the cycle of the first signal corresponding to the remainder, wherein,
the cycle control portion calculates a sum of remainders as necessary, and controls the cycles of the second signal when the sum exceeds a threshold.

23. A nontransitory computer readable medium encoded with a macro for use in a semiconductor circuit includible in a receiver for use in a system with a transmitter transmitting a sampling frequency, a first natural number, and a second natural number to a receiver, along with a pixel clock required for video data reproduction, the first natural number and the second natural number being a numerator and a denominator, respectively, in a rational relationship where a frequency of the pixel clock is divided by a frequency of an audio reference clock, the macro comprising:
a first frequency divider for outputting a first signal by dividing a signal with a frequency corresponding to the pixel clock or an integral multiple thereof by a reciprocal of an integral multiple of the first natural number, the integral multiple of the first natural number being greater than or equal to 1; and
a cycle control portion for outputting a second signal having first and second cycles included within a cycle of the first signal by controlling a cycle of the pixel clock, the first cycle corresponding to a quotient which, along with a remainder, results from the integral multiple of the first natural number divided by a third natural number equal to or different from the second natural number, the number of first cycles included within the cycle of the first signal corresponding to a first value for the third natural number minus the remainder, the second cycle corresponding to a second value for the quotient plus 1, the number of second cycles included within the cycle of the first signal corresponding to the remainder, wherein, the cycle control portion calculates a sum of remainders as necessary, and controls the cycles of the second signal when the sum exceeds a threshold.

24. A method for generating a desired audio reference clock for use on a receiver side in a system with a transmitter transmitting a sampling frequency, a first natural number, and a second natural number to a receiver, along with a pixel clock required for video data reproduction, the first natural number and the second natural number being a numerator and a denominator, respectively, in a rational relationship where a frequency of the pixel clock is divided by a frequency of an audio reference clock, the method comprising:

outputting a first signal by dividing a signal with a frequency corresponding to the pixel clock or an integral multiple thereof by a reciprocal of an integral multiple of the first natural number, the integral multiple of the first natural number being greater than or equal to 1;

outputting a second signal having first and second cycles included within a cycle of the first signal by controlling a cycle of the pixel clock, the first cycle corresponding to a quotient which, along with a remainder, results from the integral multiple of the first natural number divided by a third natural number equal to or different from the second natural number, the number of first cycles included within the cycle of the first signal corresponding to a first value for the third natural number minus the remainder, the second cycle corresponding to a second value for the quotient plus 1, the number of second cycles included within the cycle of the first signal corresponding to the remainder; and calculating a sum of remainders as necessary when outputting the second signal, and controlling the cycles of the second signal when the sum exceeds a threshold.

25. A frequency divider having provided thereto a pixel clock, a first natural number, and a second natural number, the divider comprising:

a first frequency divider for outputting a first signal by dividing a signal with a frequency corresponding to the pixel clock or an integral multiple thereof by a reciprocal of an integral multiple of the first natural number, the integral multiple of the first natural number being greater than or equal to 1; and a cycle control portion for outputting a second signal having first and second cycles included within a cycle of the first signal by controlling a cycle of the pixel clock, the first cycle corresponding to a quotient which, along with a remainder, results from the integral multiple of the first natural number divided by a third natural number equal to or different from the second natural number, the number of first cycles included within the cycle of the first signal corresponding to a first value for the third natural number minus the remainder, the second cycle corresponding to a second value for the quotient plus 1, the number of second cycles included within the cycle of the first signal corresponding to the remainder, wherein, the cycle control portion calculates a sum of remainders as necessary, and controls the cycles of the second signal when the sum exceeds a threshold.

26. A nontransitory computer readable storage medium having stored therein a program executable on a computer device for use in a system with a transmitter transmitting a sampling frequency, a first natural number, and a second natural number to a receiver, along with a pixel clock required for video data reproduction, the first natural number and the second natural number being a numerator and a denominator, respectively, in a rational relationship where a frequency of the pixel clock is divided by a frequency of an audio reference clock, the program causing the computer device to:

divide a signal with a frequency corresponding to the pixel clock or an integral multiple thereof by a reciprocal of an integral multiple of the first natural number, the integral multiple of the first natural number being greater than or equal to 1; and control a cycle of the pixel clock such that first and second cycles are included within a cycle of the divided signal, the first cycle corresponding to a quotient which, along with a remainder, results from the integral multiple of the first natural number divided by a third natural number equal to or different from the second natural number, the number of first cycles included within the cycle of the divided signal corresponding to a first value for the third natural number minus the remainder, the second cycle corresponding to a second value for the quotient plus 1, the number of second cycles included within the cycle of the divided signal corresponding to the remainder, wherein, the computer device is caused to calculate a sum of remainders as necessary in preparation for controlling the cycle of the pixel clock, such that the cycle of the pixel clock is controlled when the sum exceeds a threshold.

* * * * *